(12) United States Patent
Singh et al.

(10) Patent No.: US 8,908,359 B2
(45) Date of Patent: Dec. 9, 2014

(54) POWER INVERTER CASING HAVING AN ILLUMINATING ELEMENT

(71) Applicants: Yugandhara Singh, Bangalore (IN); Harindranath K. Sharma, Bangalore (IN); Narendra Anand Hardikar, Bangalore (IN); Poovanna Theethira Kushalappa, Bangalore (IN)

(72) Inventors: Yugandhara Singh, Bangalore (IN); Harindranath K. Sharma, Bangalore (IN); Narendra Anand Hardikar, Bangalore (IN); Poovanna Theethira Kushalappa, Bangalore (IN)

(73) Assignee: Sabic Global Technologies B.V. (NL)

( * ) Notice: Subject to any disclaimer, the term of this patent is extended or adjusted under 35 U.S.C. 154(b) by 215 days.

(21) Appl. No.: 13/629,724

(22) Filed: Sep. 28, 2012

(65) Prior Publication Data

US 2014/0092530 A1    Apr. 3, 2014

(51) Int. Cl.
  *H05K 5/00*     (2006.01)
  *H05K 7/00*     (2006.01)
(52) U.S. Cl.
  USPC .................. 361/679.01; D14/349; D14/356; D14/357
(58) Field of Classification Search
  CPC ..... H05K 7/00; H05K 5/0086; H05K 5/0004; H05K 2201/10106
  USPC .................. 361/679.01; D14/356, 357, 349; D21/616; D13/156
  See application file for complete search history.

(56) References Cited

U.S. PATENT DOCUMENTS

| | | | | |
|---|---|---|---|---|
| D269,887 S | * | 7/1983 | Nakao et al. | D21/616 |
| D284,656 S | * | 7/1986 | Lee | D14/143 |
| 5,140,108 A | * | 8/1992 | Miyajima | 174/563 |
| 5,558,044 A | * | 9/1996 | Nasser et al. | 119/796 |
| 5,887,550 A | * | 3/1999 | Levine et al. | 119/796 |
| 5,982,138 A | | 11/1999 | Krieger | |
| 6,553,629 B2 | * | 4/2003 | Grady et al. | 16/444 |
| 6,592,240 B2 | * | 7/2003 | Camarota et al. | 362/399 |
| 6,987,665 B2 | * | 1/2006 | Pavlacka et al. | 361/641 |
| 7,304,852 B2 | * | 12/2007 | Hernandez et al. | 361/714 |
| 7,817,405 B2 | * | 10/2010 | Neumann et al. | 361/625 |
| D654,870 S | * | 2/2012 | Pehlari | D13/110 |
| 2002/0105230 A1 | | 8/2002 | Ziegler et al. | |
| 2007/0008706 A1 | * | 1/2007 | Lai | 361/796 |
| 2008/0153959 A1 | | 6/2008 | Charati et al. | |

FOREIGN PATENT DOCUMENTS

WO    2012114309 A1    8/2012
WO    2012114310 A1    8/2012

OTHER PUBLICATIONS

International Search Report; International Application No. PCT/IB201/057646; International Filing Date: Dec. 21, 2012; Date of Mailing: Sep. 19, 2013; 5 Pages.
Written Opinion of the International Searching Authority; International Application No. PCT/IB2012/057646; International Filing Date: Dec. 21, 2012; Date of Mailing: Sep. 19, 2013; 5 Pages.

* cited by examiner

*Primary Examiner* — Lisa Lea Edmonds
*Assistant Examiner* — Keith Depew
(74) *Attorney, Agent, or Firm* — Cantor Colburn LLP

(57) ABSTRACT

In an embodiment, a power inverter casing, comprises: a body having a first component removably attached to a second component, wherein, when joined, a recess is formed therebetween; a member removably attached to the first component and the second component opposite the recess; and a handle located in the recess and removably attached to the first component and the second component; wherein the member contains a first member illuminating element, and/or the recess contains a recess illuminating element, and/or the handle contains a handle illuminating element.

18 Claims, 16 Drawing Sheets

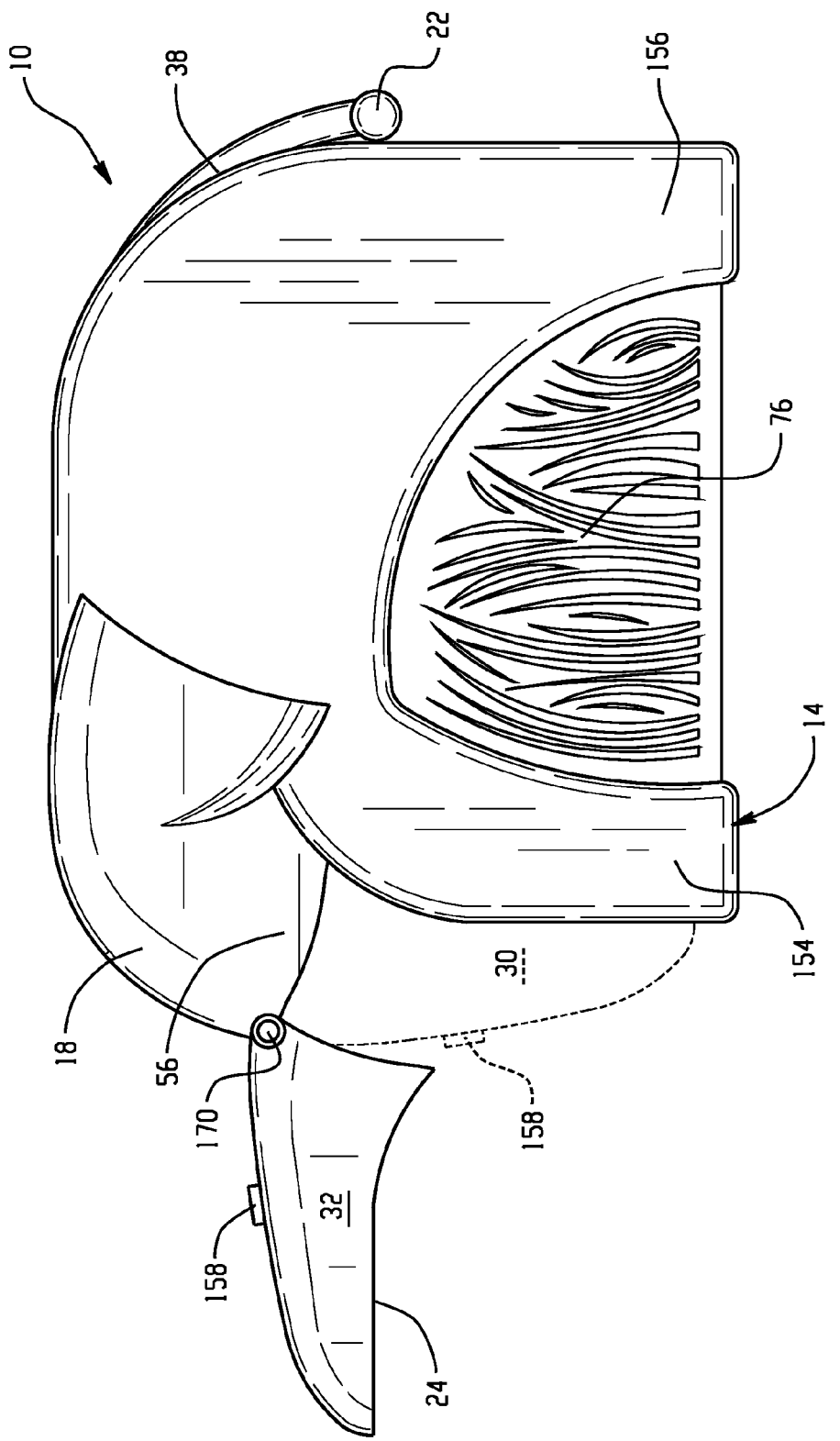

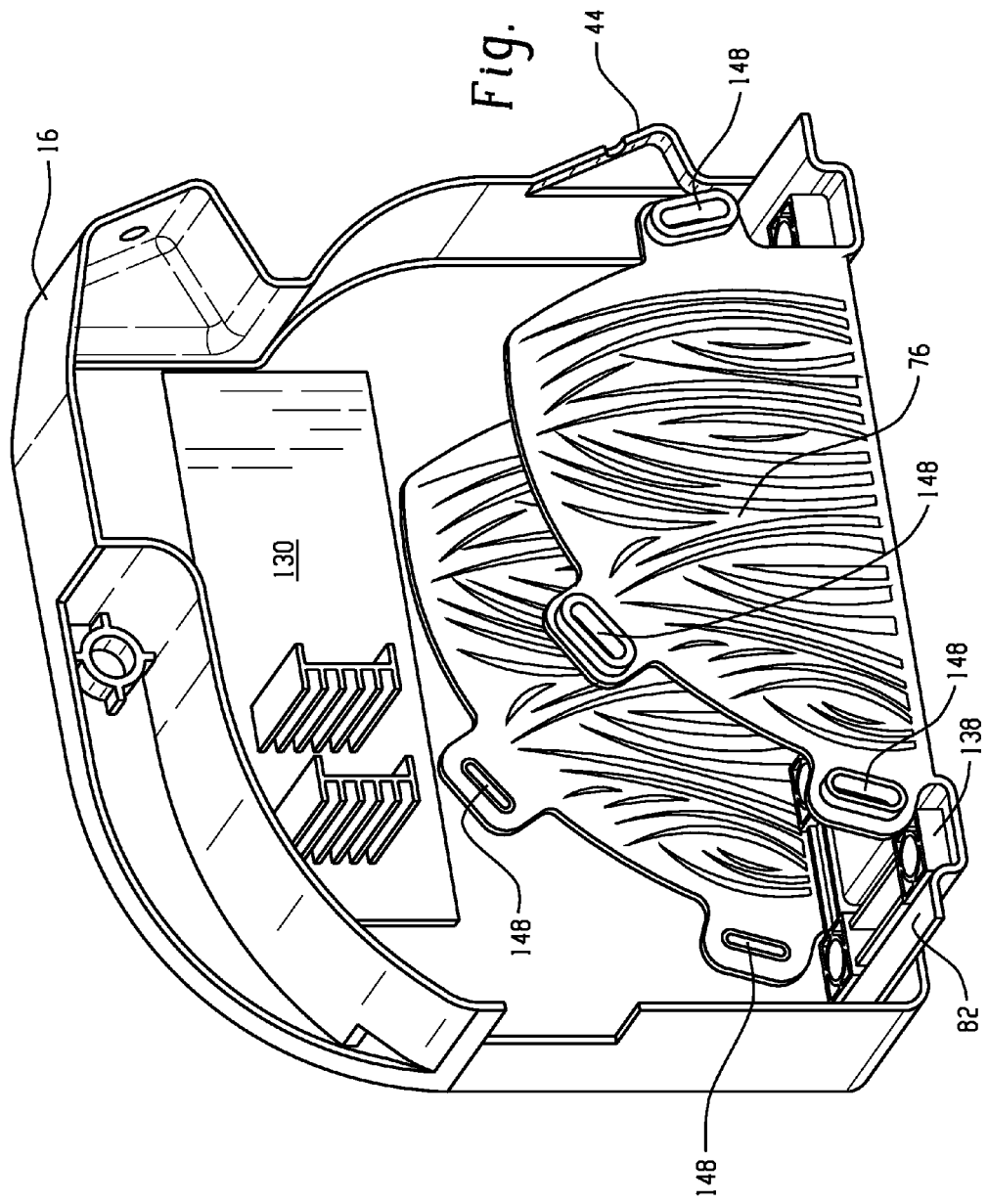

POWER INVERTER CASING HAVING AN ILLUMINATING ELEMENT

TECHNICAL FIELD

Disclosed herein are inverters, specifically power inverters.

BACKGROUND

Inverters are electrical devices that are generally connected to a power supply and convert a part of incoming electricity (e.g., convert direct current (DC) to alternating current (AC)) to supply power. Inverters can also convert a part of incoming electricity and store it in a storage device, which is utilized to supply power when a power outage occurs. Inverters are generally surrounded by a housing that protects the inverter components from damage, heat, electric shock or other outside elements that could impair the functionality of the inverter. Inverter housings made from sheet metal with slots or perforations for dissipation of internal heat by conduction or convection suffer from a lack of design freedom, which restrict the possibilities for aesthetic enhancement. The use of metal for inverter housings also increases the weight of the inverter system and requires the use of secondary operations such as painting, and powder coating. This increases the overall time to produce the inverter and the inverter housing, thus leading to increased production costs.

Thus, there is a need for inverter housings with increased design freedom and that are lighter in weight than all metal designs, and which can be produced and assembled more quickly, eliminating some or all secondary operations.

SUMMARY

Disclosed herein, in various embodiments, are power inverters.

In an embodiment, a power inverter casing, comprises: a body having a first component removably attached to a second component, wherein, when joined, a recess is formed therebetween; a member removably attached to the first component and the second component opposite the recess; and a handle located in the recess and removably attached to the first component and the second component; wherein the member contains a first member illuminating element, and/or the recess contains a recess illuminating element, and/or the handle contains a handle illuminating element.

In an embodiment, a power inverter casing comprises: a body having a first component removably attached to a second component, wherein, when joined, a recess is formed therebetween; a member removably attached to the first component and the second component opposite the recess; and a handle located in the recess and removably attached to the first component and the second component; wherein the member comprises a pivotable portion and a stationary portion, wherein the pivotable portion rotates from a closed position to an open position exposing a member illuminating element.

In an embodiment, a power inverter casing comprises: a body having an animal shape having a first component removably attached to a second component, wherein, when joined, a recess is formed therebetween; a member removably attached to the first component and the second component opposite the recess; and a handle located in the recess and removably attached to the first component and the second component; wherein the member contains a first member illuminating element, and/or the recess contains a recess illuminating element, and/or the handle contains a handle illuminating element.

BRIEF DESCRIPTION OF THE DRAWINGS

The following is a brief description of the drawings wherein like elements are numbered alike and which are presented for the purposes of illustrating the exemplary embodiments disclosed herein and not for the purposes of limiting the same.

FIG. 3 is a side view of a power inverter casing.
FIG. 24 is an isometric side view of a power inverter casing.

DETAILED DESCRIPTION

Figure 1:
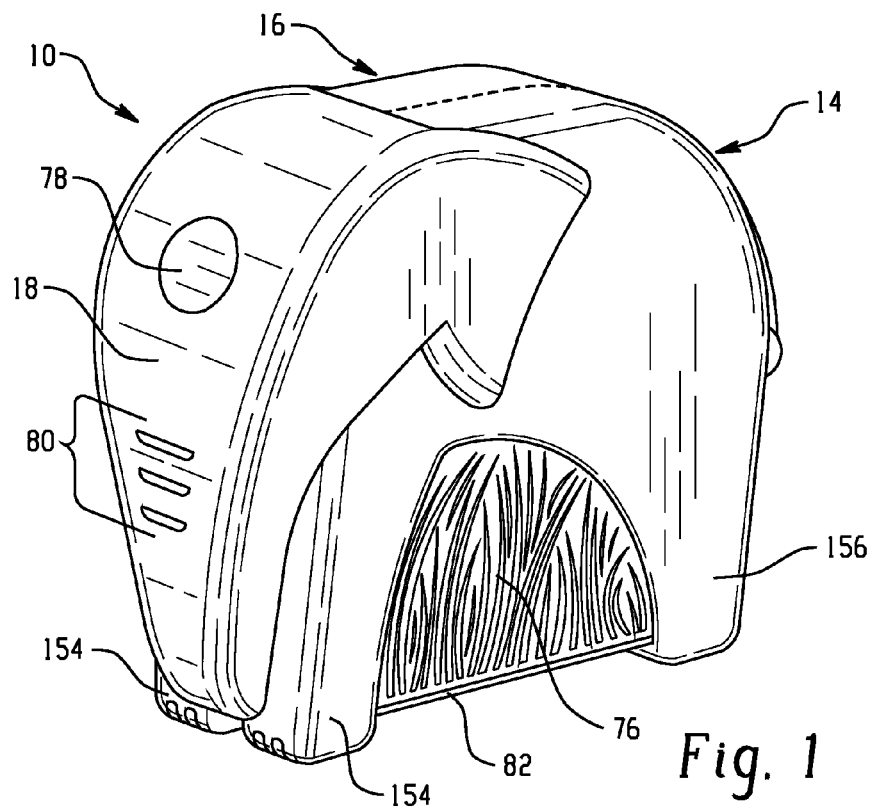
FIG. 1 is a front isometric view of a power inverter casing.

Disclosed herein, in various embodiments is a power inverter and power inverter casings. A power inverter casing houses the internal components of an inverter. The inverter comprises many components including, but not limited to, a transformer, a capacitor, electrical connectors, power semiconductors, a printed circuit board (PCB), heat sinks, and/or a battery, etc. The transformer can alter the voltage of the transformer (e.g., can raise or lower the voltage). The power inverter casing disclosed herein can comprise a thermoplastic material to decrease the overall weight of the inverter assembly and to allow design freedom for various casing designs. The power inverter casings disclosed herein can offer design freedom and reduced weight as compared to power inverters that are made from metal. For example, the power inverter casings disclosed herein can comprise a polymeric material, which can offer increased design freedom and a lighter weight as compared to a casing made from metal. The power inverter casing can generally comprise a body having a first component and a second component having a generally arcuate shape. The arcuate shape of the first component and the second component can be configured to accept grills that are connected therebetween with a platform. The grills can be designed to allow air to pass through between them, helping to cool the internal components of the power inverter.

As described, the power inverter casings disclosed herein can be formed from thermoplastic materials. Possible thermoplastic resins that may be employed to form the power inverter casings include, but are not limited to, oligomers, polymers, ionomers, dendrimers, and copolymers (such as graft copolymers, block copolymers (e.g., star block copolymers, random copolymers, etc.)) and combinations comprising at least one of the foregoing. Examples of such thermoplastic resins include, but are not limited to, polycarbonates (e.g., blends of polycarbonate (such as, polycarbonate-polybutadiene blends, copolyester polycarbonates)), polystyrenes (e.g., copolymers of polycarbonate and styrene, polyphenylene ether-polystyrene blends), polyimides (e.g., polyetherimides), acrylonitrile-styrene-butadiene (ABS), polyalkylmethacrylates (e.g., polymethylmethacrylates), polyesters (e.g., copolyesters, polythioesters), polyolefins (e.g., polypropylenes and polyethylenes, high density polyethylenes, low density polyethylenes, linear low density polyethylenes), polyamides (e.g., polyamideimides), polyarylates, polysulfones (e.g., polyarylsulfones, polysulfonamides), polyphenylene sulfides, polytetrafluoroethylenes, polyethers (e.g., polyether ketones, polyether etherketones, polyethersulfones), polyacrylics, polyacetals, polybenzoxazoles (e.g., polybenzothiazinophenothiazines, polybenzothiazoles), polyoxadiazoles, polypyrazinoquinoxalines, polypyromellitimides, polyquinoxalines, polybenzimidazoles, polyoxindoles, polyoxoisoindolines (e.g., polydioxoisoindolines), polytriazines, polypyridazines, polypiperazines, polypyridines, polypiperidines, polytriazoles, polypyrazoles, polypyrrolidines, polycarboranes, polyoxabicyclononanes, polydibenzofurans, polyphthalides, polyacetals, polyanhydrides, polyvinyls (e.g., polyvinyl ethers, polyvinyl thioethers, polyvinyl alcohols, polyvinyl ketones, polyvinyl halides, polyvinyl nitriles, polyvinyl esters, polyvinylchlorides), polysulfonates, polysulfides, polyureas, polyphosphazenes, polysilazzanes, polysiloxanes, and combinations comprising at least one of the foregoing.

More particularly, the plastic used in the power inverter casings can include, but is not limited to, polycarbonate resins (e.g., LEXAN* resins, commercially available from SABIC Innovative Plastics), polyphenylene ether-polystyrene resins (e.g., NORYL* resins, commercially available from SABIC Innovative Plastics), polyetherimide resins (e.g., ULTEM* resins, commercially available from SABIC Innovative Plastics), polybutylene terephthalate-polycarbonate resins (e.g., XENOY* resins, commercially available from SABIC Innovative Plastics), copolyestercarbonate resins (e.g. LEXAN* SLX resins, commercially available from SABIC Innovative Plastics), polycarbonate-acrylonitrile butadiene styrene resins (e.g., CYCOLOY*, commercially available from SABIC Innovative Plastics), and combinations comprising at least one of the foregoing resins. Even more particularly, the thermoplastic resins can include, but are not limited to, homopolymers and copolymers of a polycarbonate, a polyester, a polyacrylate, a polyamide, a polyetherimide, a polyphenylene ether, or a combination comprising at least one of the foregoing resins. The polycarbonate can comprise copolymers of polycarbonate (e.g., polycarbonate-polysiloxane, such as polycarbonate-polysiloxane block copolymer), linear polycarbonate, branched polycarbonate, end-capped polycarbonate (e.g., nitrile end-capped polycarbonate), and combinations comprising at least one of the foregoing, for example, a combination of branched and linear polycarbonate.

The thermoplastic material can be or can comprise a thermally conductive plastic material. The thermally conductive plastic can also be electrically insulating, e.g., having an electrical resistivity greater than or equal to $10^{13}$ Ohms per meter (Ohm/m). The thermally conductive plastic can comprise an organic polymer and a filler composition comprising graphite and boron nitride. For example, the thermally conductive plastic can have a bulk surface resistivity greater than or equal to $10^{13}$ Ohm/m, while displaying a thermal conductivity greater than or equal to 2 Watts per meter Kelvin (W/mK). The melt flow index can be 1 to 30 grams per 10 minutes at a temperature of 280° C. and a load of 16 kilograms force per square centimeter (kg-f/cm$^2$). Exemplary thermally conductive plastics are disclosed in commonly assigned International Patent Publication No. 2012/114310, International Publication No. 2012/114309, and U.S. Patent Publication No. 2008/0153959.

The organic polymer used in the thermally conductive plastic can be selected from a wide variety of thermoplastic resins, blends of thermoplastic resins, thermosetting resins, or blends of thermoplastic resins with thermosetting resins, as well as combinations comprising at least one of the foregoing. The organic polymer may also be a blend of polymers, copolymers, terpolymers, or combinations comprising at least one of the foregoing organic polymers. The organic polymer can also be an oligomer, a homopolymer, a copolymer, a block copolymer (e.g., an alternating block copolymer, a random block copolymer, a star block copolymer), a random polymer, a random copolymer, a graft copolymer, a dendrimer, or the like, or a combination comprising at last one of the foregoing organic polymers. Examples of the organic polymer include polyacetals, polyolefins, polyacrylics, poly (arylene ether) polycarbonates, polystyrenes, polyesters (e.g., cycloaliphatic polyester, high molecular weight polymeric glycol terephthalates or isophthalates, and so forth), polyamides (e.g., semi-aromatic polyamid such as PA4.T, PA6.T, PA9.T, and so forth), polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, styrene acrylonitrile, acrylonitrile-butadiene-styrene (ABS), polyethylene terephthalate, polybutylene terephthalate, polyurethane, ethylene propylene diene rubber (EPR), polytetrafluoroethylene, fluorinated ethylene propylene, perfluoroalkoxyethylene, polychlorotrifluoroethylene, polyvinylidene fluoride, or the like, or a combination comprising at least one of the foregoing organic polymers. Examples of polyolefins include polyethylene (PE), including high-density polyethylene (HDPE), linear low-density polyethylene (LLDPE), low-density polyethylene (LDPE), mid-density polyethylene (MDPE), glycidyl methacrylate modified polyethylene, maleic anhydride functionalized polyethylene, maleic anhydride functionalized elastomeric ethylene copolymers (like EXXELOR™ VA1801 and VA1803 from ExxonMobil), ethylene-butene copolymers, ethylene-octene copolymers, ethylene-acrylate copolymers, such as ethylene-methyl acrylate, ethylene-ethyl acrylate, and ethylene butyl acrylate copolymers, glycidyl methacrylate functionalized ethylene-acrylate terpolymers, anhydride functionalized ethylene-acrylate polymers, anhydride functionalized ethylene-octene and anhydride functionalized ethylene-butene copolymers, polypropylene (PP), maleic anhydride functionalized polypropylene, glycidyl methacrylate modified polypropylene, and a combination comprising at least one of the foregoing organic polymers.

In the context of this application a 'semi-aromatic polyamide' is understood to be a polyamide homo- or copolymer that contains aromatic or semi-aromatic units derived from an aromatic dicarboxylic acid, an aromatic diamine or an aromatic aminocarboxylic acid, the content of said units being at least 50 mol %. In some cases these semi-aromatic polyamides are blended with small amounts of aliphatic polyamides for better processability. They are available commercially e.g. DuPont, Wilmington, Del., USA under the Tradename Zytel HTN, Solvay Advanced Polymers under the Tradename Amodel or from DSM, Sittard, The Netherlands under the Tradename Stanyl For Tii.

Examples of blends of thermoplastic resins include acrylonitrile-butadiene-styrene/nylon, polycarbonate/acrylonitrile-butadiene-styrene, acrylonitrile butadiene styrene/polyvinyl chloride, polyphenylene ether/polystyrene, polyphenylene ether/nylon, polysulfone/acrylonitrile-butadiene-styrene, polycarbonate/thermoplastic urethane, polycarbonate/polyethylene terephthalate, polycarbonate/polybutylene terephthalate, thermoplastic elastomer alloys, nylon/elastomers, polyester/elastomers, polyethylene terephthalate/polybutylene terephthalate, acetal/elastomer, styrene-maleicanhydride/acrylonitrile-butadiene-styrene, polyether etherketone/polyethersulfone, polyether etherketone/polyetherimide polyethylene/nylon, polyethylene/polyacetal, or the like.

Examples of thermosetting resins include polyurethane, natural rubber, synthetic rubber, epoxy, phenolic, polyesters, polyamides, silicones, or the like, or a combination comprising at least one of the foregoing thermosetting resins. Blends of thermoset resins as well as blends of thermoplastic resins with thermoset resins can be utilized.

In one embodiment, an organic polymer that can be used in the conductive composition is a poly(arylene ether). The term poly(arylene ether) polymer includes polyphenylene ether (PPE) and poly(arylene ether) copolymers; graft copolymers; poly(arylene ether) ionomers; and block copolymers of alkenyl aromatic compounds with poly(arylene ether)s, vinyl aromatic compounds, and poly(arylene ether), and the like; and combinations including at least one of the foregoing.

The organic polymer can be used in amounts of 10 to 85 weight percent (wt. %), specifically, 25 wt. % to 80 wt. %, more specifically 35 wt. % to 75 wt. %, and yet more specifically 40 wt. % to 70 wt. %, of the total weight of the moldable composition.

The filler composition used in the moldable composition comprises graphite and boron nitride. It is desirable to use graphite having average particle sizes of 1 to 5,000 micrometers. Within this range graphite particles having sizes of greater than or equal to 3 micrometers, specifically greater than or equal to 5 micrometers may be advantageously used. Also desirable are graphite particles having sizes of less than or equal to 4,000 micrometers, specifically less than or equal to 3,000 micrometers, and more specifically less than or equal to 2,000 micrometers. Graphite is generally flake like with an aspect ratio (i.e., minor axis/major axis) greater than or equal to 2, specifically greater than or equal to 5, more specifically greater than or equal to 10, and even more specifically greater than or equal to 50. In one aspect, the graphite is flake graphite, wherein the flake graphite is typically found as discrete flakes having a size of 10 micrometers to 800 micrometers in diameter (as measured along a major axis) and 1 micrometer to 150 micrometers thick, e.g., with purities ranging from 80-99.9% carbon. In another aspect the graphite is spherical.

Graphite is generally used in amounts of greater than or equal to 10 wt. % to 30 wt. %, specifically, 13 wt. % to 28 wt. %, more specifically 14 wt. % to 26 wt. %, and yet more specifically 15 wt. % to 25 wt. %, of the total weight of the moldable composition.

Boron nitride may be cubic boron nitride, hexagonal boron nitride, amorphous boron nitride, rhombohedral boron nitride, or another allotrope. It may be used as powder, agglomerates, fibers, or the like, or a combination comprising at least one of the foregoing.

Boron nitride has an average particle size of 1 to 5,000 micrometers. Within this range boron nitride particles having sizes of greater than or equal to 3 micrometers, specifically greater than or equal to 5 micrometers may be advantageously used. Also desirable are boron nitride particles having sizes of less than or equal to 4,000 micrometers, specifically less than or equal to 3,000 micrometers, and more specifically less than or equal to 2,000 micrometers. Boron nitride is generally flake like with an aspect ratio greater than or equal to 2, specifically greater than or equal to 5, more specifically greater than or equal to 10, and even more specifically greater than or equal to 50. An exemplary particle size is 125 to 300 micrometers with a crystal size of 10 to 15 micrometers. The boron nitride particles can exist in the form of agglomerates or as individual particles or as combinations of individual particles and agglomerates. Exemplary boron nitrides are PT350, PT360, or PT 370, commercially available from Momentive Performance Materials.

Boron nitride (BN) is generally used in amounts of 5 wt. % to 60 wt. %, specifically, 8 wt. % to 55 wt. %, more specifically 10 wt. % to 50 wt. %, and yet more specifically 12 wt. % to 45 wt. %, of the total weight of the moldable composition. An exemplary amount of boron nitride is 15 wt. % to 40 wt. % of the total weight of the thermally conductive plastic. In one aspect, the BN has a BN purity of 95% to 99.8%. For example, a large single crystal sized flake BN with an average size of 3 to 50 micrometers and a BN purity of over 98% can be used. The particle size indicated here means the single BN particle or its agglomerate at any of their dimensions.

One or more thermally conductive fillers can be used. The thermally conductive, electrically insulative filler has an intrinsic thermal conductivity of less than 30 W/mK, e.g., 10 to 30 W/mK, specifically, 15 to 30 W/mK, and more specifically, 15 to 20 W/mK. The resistivity can be greater than or equal to $10^5$ (Ohm·centimeter). Examples of the thermally conductive filler include, but are not limited to, ZnS (zinc sulfide), CaO (calcium oxide), MgO (magnesium oxide), ZnO (zinc oxide), $TiO_2$ (titanium dioxide), or a combination comprising at least one of the foregoing.

One or more high thermally conductive, electrically insulative fillers and/or one or more high thermally conductive, electrically conductive fillers can be used. The high thermally conductive filler has an intrinsic thermal conductivity greater than or equal to 50 W/mK, specifically, greater than or equal to 100 W/mK, more specifically, greater than or equal to 150 W/mK. The resistivity of an electrically insulative filler can be greater than or equal to $10^5$ Ohm·cm. Examples of the high thermally conductive, electrically insulative filler include, but are not limited to, MN (aluminum nitride), BN (boron nitride), $MgSiN_2$ (magnesium silicon nitride), SiC (silicon carbide), ceramic-coated graphite, or a combination comprising at least one of the foregoing. The resistivity of an electrically conductive filler can be less than or equal to 1 Ohm·cm.

Examples of the high thermally conductive, electrically conductive filler include, but are not limited to, graphite, expanded graphite, graphene, carbon fiber, carbon nanotubes (CNT), graphitized carbon black, or a combination comprising at least one of the foregoing.

Additionally, the thermally conductive plastic can optionally also contain additives such as antioxidants, such as, for example, organophosphites, for example, tris(nonyl-phenyl) phosphite, tris(2,4-di-t-butylphenyl)phosphite, bis(2,4-di-t-butylphenyl)pentaerythritol diphosphite or distearyl pentaerythritol diphosphite, alkylated monophenols, polyphenols and alkylated reaction products of polyphenols with dienes, such as, for example, tetrakis[methylene(3,5-di-tert-butyl-4-hydroxyhydrocinnamate)]methane, 3,5-di-tert-butyl-4-hydroxyhydrocinnamate, octadecyl 2,4-di-tert-butylphenyl phosphite, butylated reaction products of para-cresol and dicyclopentadiene, alkylated hydroquinones, hydroxylated thiodiphenyl ethers, alkylidene-bisphenols, benzyl compounds, esters of beta-(3,5-di-tert-butyl-4-hydroxyphenyl)-propionic acid with monohydric or polyhydric alcohols, esters of beta-(5-tert-butyl-4-hydroxy-3-methylphenyl)-propionic acid with monohydric or polyhydric alcohols; esters of thioalkyl or thioaryl compounds, such as, for example, distearylthiopropionate, dilaurylthiopropionate, ditridecylthiodipropionate, amides of beta-(3,5-di-tert-butyl-4-hydroxyphenyl)-propionic acid; fillers and reinforcing agents, such as, for example, silicates, titanium dioxide ($TiO_2$), calcium carbonate, talc, mica and other additives such as, for example, mold release agents, ultraviolet absorbers, stabilizers such as light stabilizers and others, lubricants, plasticizers, pigments, dyes, colorants, anti-static agents, blowing agents, flame retardants, impact modifiers, among others, as well as combinations comprising at least one of the foregoing additives.

Optionally, the thermally conductive plastic can comprise a random distribution of graphite and boron nitride and have a thermal conductivity of greater than 2 W/mK. For example, the thermally conductive plastic can have a thermal conductivity of 2 W/mK to 6 W/mK, specifically, 2.2 W/mK to 4.0 W/mK, more specifically 2.3 W/mK to 3.9 W/mK, and yet more specifically 2.4 W/mK to 3.8 W/mK. In one embodiment, the thermally conductive plastic comprises: 35 volume percent (vol %) to 80 vol % of a thermoplastic polymer; 5 vol % to 45 vol % of a thermally insulative filler with an intrinsic thermal conductivity less than or equal to 10 W/mK; and 5 vol % to 15 vol % of a thermally conductive filler with an intrinsic thermal conductivity greater than or equal to 50 W/mK. The thermally conductive plastic can have a thermal conductivity of greater than or equal to 2.0 W/mK, and/or a volume resistivity of greater than or equal to $10^7$ Ohm-centimeter (Ohm·cm). Optionally, the thermally conductive filler can comprise MN, BN, $MgSiN_2$, SiC, graphite, ceramic-coated graphite, expanded graphite, graphene, a carbon fiber, a carbon nanotube, graphitized carbon black, or a combination comprising at least one of the foregoing thermally conductive fillers. For example, the thermoplastic polymer can comprise a polyamide, polyester, polyethylene and ethylene based copolymer, polypropylene, polyphenylene sulfide, or a combination comprising at least one of the foregoing; the thermally insulative filler can comprise talc, $CaCO_3$, $Mg(OH)_2$, or a combination comprising at least one of the foregoing; and the thermally conductive filler can comprise graphite.

The composition can comprise: 35 vol % to 80 vol % of a thermoplastic polymer; 5 vol % to 45 vol % of a low thermally conductive, electrically insulative filler with an intrinsic thermal conductivity of 10 W/mK to 30 W/mK; 2 vol % to 15 vol % of a high thermally conductive, electrically insulative filler with an intrinsic thermal conductivity greater than or equal to 50 W/mK; and 2 vol % to 15 vol % of a high thermally conductive, electrically conductive filler with an intrinsic thermal conductivity greater than or equal to 50 W/mK. The composition can have a thermal conductivity of at least 1.0 W/mK and/or a volume resistivity of at least $10^7$ Ohm·cm.

Intrinsic thermal conductivity of a component, as used herein, is based on indicative values described in the literature, such as in "Thermal conductivity of Nonmetallic Solids," Y. S. Touloukian, R. W. Powell, C. Y. Ho, and P. G. Klemans, IFI/Plenum: New York-Washington, 1970 or "Thermal Conductivity—Theory, Properties and Applications," T. M. Tritt, Ed., Kluwer Academic/Plenum Publishers: New York, 2004. Thermal conductivity of a composition, as used herein, is tested according to ASTM E1461 in the through-plane (sample thickness) direction. It is the thermal conductivity of the material independent of how much of the material is present and independent of the form (shape, size, etc.) of the material.

Volume resistivity, as used herein, is measured by notching a sample bar on both ends followed by a cold-fracture at $-60°$ C. The fractured surfaces are treated with silver paint and dried. The resistance through the bar is measured with a multi-meter to yield the volume resistivity (in $\Omega \cdot m$) and calculated from: volume resistivity=$(R*A/L)$, where R is the electrical resistance (in $\Omega$), A is the sample surface area, and L is the sample length (the electrical distance).

The thermoplastic material of the power inverter casing system can include various additives ordinarily incorporated into polymer compositions of this type, with the proviso that the additive(s) are selected so as to not significantly adversely affect the desired properties of the housing system, in particular, structural integrity. Such additives can be mixed at a suitable time during the mixing of the components for forming the inverter housing system. Exemplary additives include impact modifiers, fillers, reinforcing agents, antioxidants, heat stabilizers, light stabilizers, ultraviolet (UV) light stabilizers, plasticizers, lubricants, mold release agents, antistatic agents, colorants (such as carbon black and organic dyes), surface effect additives, radiation stabilizers (e.g., infrared absorbing), flame retardants, and anti-drip agents. A combination of additives can be used, for example a combination of a heat stabilizer, mold release agent, and ultraviolet light stabilizer. In general, the additives are used in the amounts generally known to be effective. The total amount of additives (other than any impact modifier, filler, or reinforcing agents) is generally 0.001 wt. % to 5 wt. %, based on the total weight of the composition of the housing system.

A more complete understanding of the components, processes, and apparatuses disclosed herein can be obtained by reference to the accompanying drawings. These figures (also referred to herein as "FIG.") are merely schematic representations based on convenience and the ease of demonstrating the present disclosure, and are, therefore, not intended to indicate relative size and dimensions of the devices or components thereof and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Figure 2:
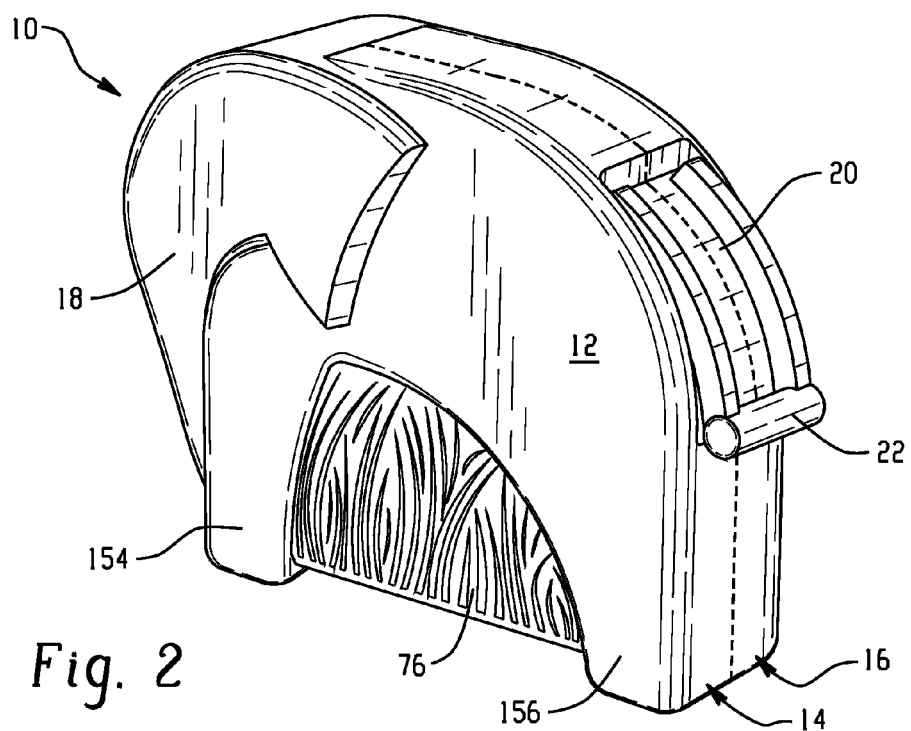
FIG. 2 is a back isometric view of a power inverter casing.

FIGS. 1 to 5 illustrate various embodiments of a power inverter casing 10. As illustrated in FIG. 2, the power inverter casing 10 can comprise a body 12 with a first component 14 removably attached to a second component 16, where the first component 14 and the second component 16 can have a generally arcuate shape. On a side of the first component 14 and on a side of the second component 16 can be an indented area such that when the first component 14 and the second component 16 are attached (e.g., joined), a recess 20 can be formed on an end of the body 12. A member 18 can be removably attached to the first component 14 and the second component 16 opposite the handle 22. The member 18 can be shaped such that it can conform to the arcuate shape of the body 12 as illustrated in FIG. 2. The power inverter casing 10 can further comprise a handle 22 located in the recess 20 and removably attached to the first component 14 and the second component 16.

FIG. 1 further illustrates that a power button 78 can be located on the member 18 and an indicator light(s) 80 can also be present to indicate the status of the system (e.g., on, off, low battery, etc.). Further illustrated in FIGS. 1, 2, and 3 can be grills 76, one of which can be removably attached to the first component 14 and one of which can be removably attached to the second component 16 wherein an open space is formed between the grills 76. Grills 76 can have a generally arcuate shape conforming to the shape of the first component 14 and the second component 16 to which they are attached. The first component 14 and/or the second component 16 can have a first leg member 154 and a second leg member 156, wherein the grills 76 extend from the first leg member 154 to the second leg member 156. A platform 82 can be present in the open space between the grills 76. The grill 76 can function to allow heat from the internal components of the transformer to dissipate from the power inverter casing 10 such that for low voltage power inverters, a fan may not be necessary inside the power inverter casing 10 and instead can be an optional component.

Figure 4:
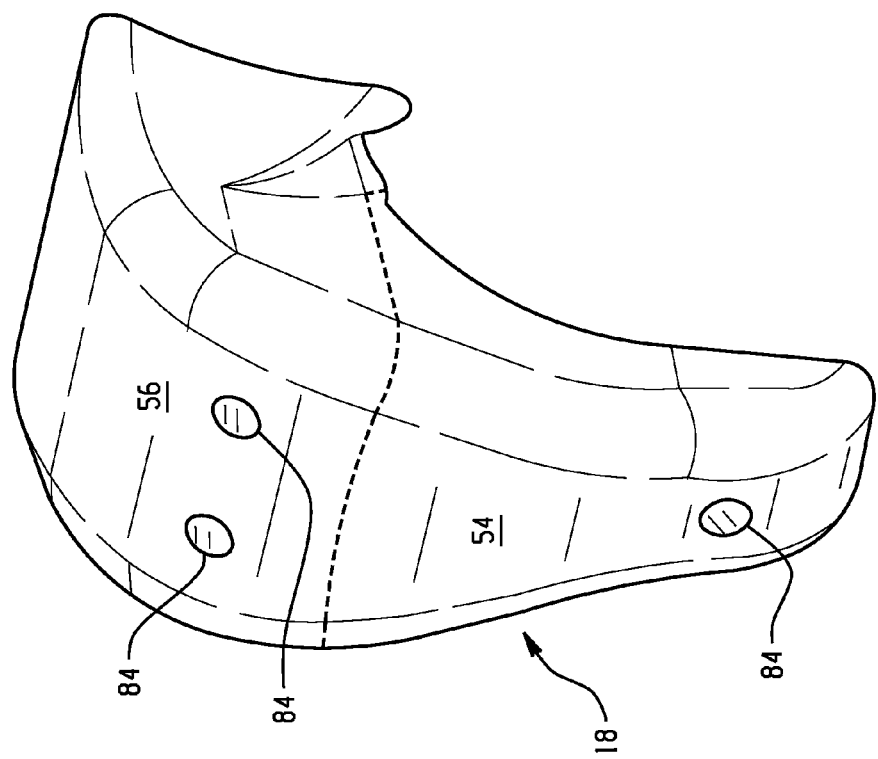
FIG. 4 is a front isometric view of a member of a power inverter casing.

Turning now to FIGS. 3 and 4, FIG. 3 demonstrates that the member 18 can comprise a stationary portion 56 and a pivotable portion 54, where the member 18 can rotate from an un-illuminated closed position 30 to an illuminated open position 32 via a pivotable portion 54 (see FIG. 4) to reveal a member illuminating element 24. The member illuminating element 24 can provide a back-up light in the case of a power outage, can be used as a nightlight (e.g., in a child's room), or can even be used as a room light when needed. As illustrated in FIG. 3, the member illuminating element 24, when in the closed position 30 rests against the first leg member 154 of the first component 14 and/or the second component 16.

The pivotable portion 54 can rotate around a pivot point 170 (see FIG. 3) that can be located on member 18. Various features can be incorporated into member 18 to retain the pivotable portion 54 in the open position 32 and in the closed position 30. The pivotable portion 54 can, alternatively, be a cover element for member illuminating element 24 so that when removed the member illuminating element 24 can be exposed. The on/off mechanism 158 (see FIG. 3) for the member illuminating element 24 can be integrated with the pivotable portion 54 of member 18 such that in the open position 32, the member illuminating element 24 is powered on and when in the closed position 30, the member illuminating element 24 is powered off. For example, as illustrated in FIG. 3, the on/off mechanism 158 can be a pin that is compressed in the closed position 30 and extended in the open position 32.

Figure 5:
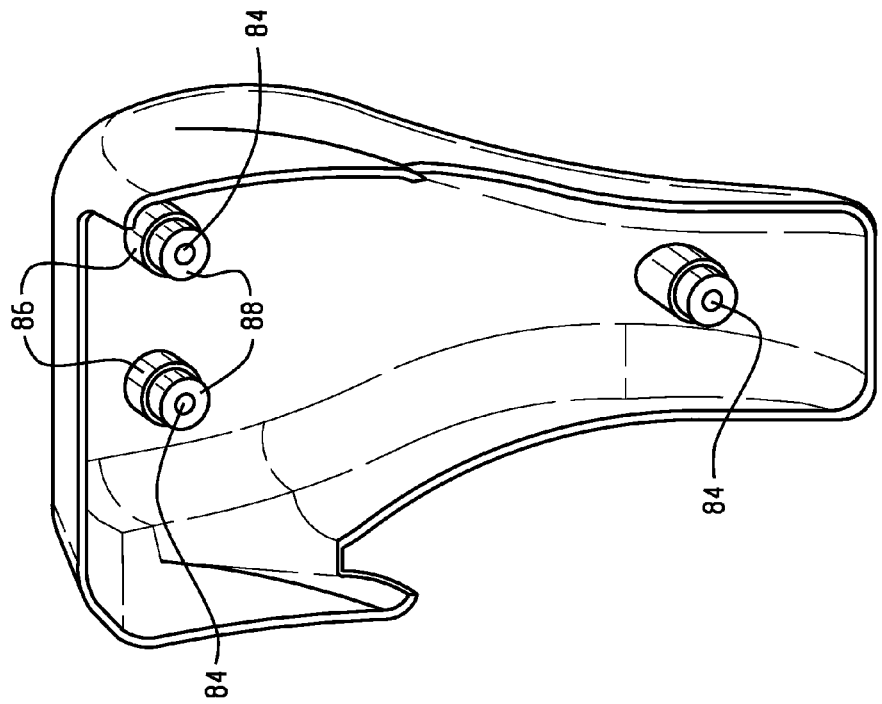
FIG. 5 is a back view of a member of a power inverter casing.

Various attachment points 84 can be located on the member 18 and can be configured to attach the member 18 to the first component 14 and/or to the second component 16. For example, as illustrated in FIGS. 4 and 5, the member 18 can be attached at three locations to the first component 14 and/or the second component 16. FIG. 5 illustrates a back view of the member 18 showing the attachment points 84 that can be configured to accept a screw, nail, bolt, rivet, etc. The attachment point 84 can, optionally, have a generally circular shape with an outer portion 86 and an inner portion 88 in a nesting arrangement as illustrated in FIG. 5. The attachment point 84 can also, optionally, be a key slot shape where the eye of the key slot can have any shape, e.g., crescent, heart, flower, etc., wherein attachment occurs at the key slot, but is not visible to the user. The member illuminating element 24 can comprise a light emitting diode.

Figure 6:
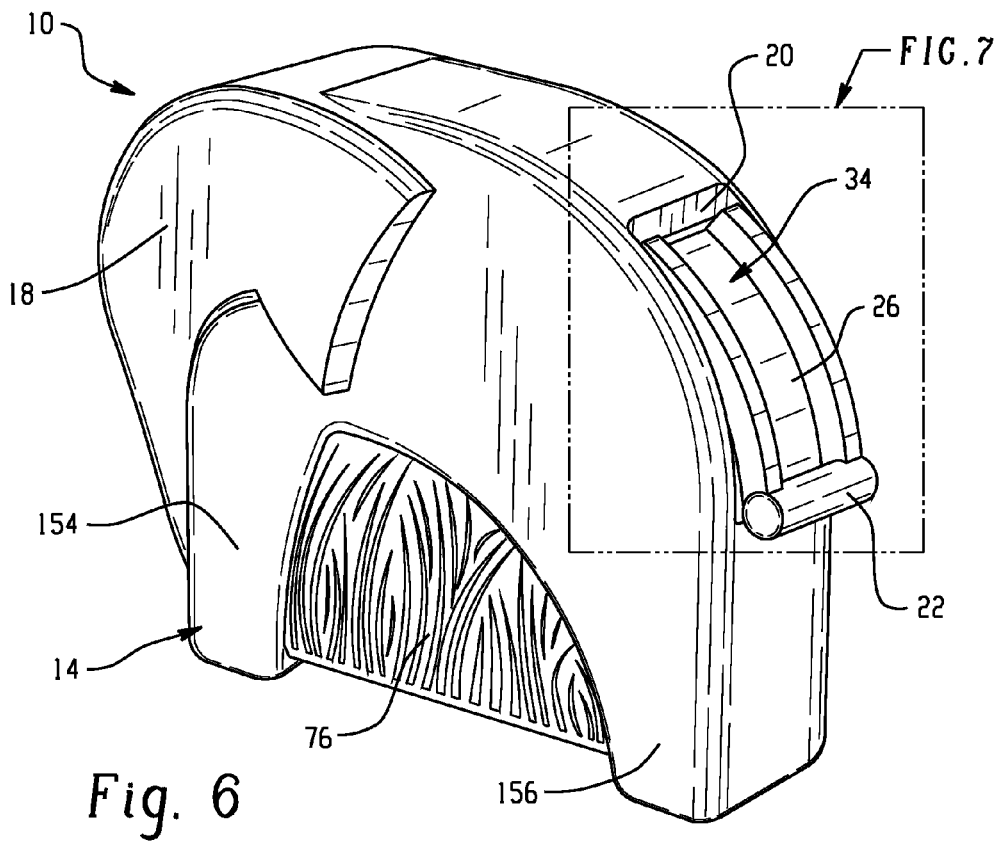
FIG. 6 is a back isometric view of a power inverter casing.
Figure 7:
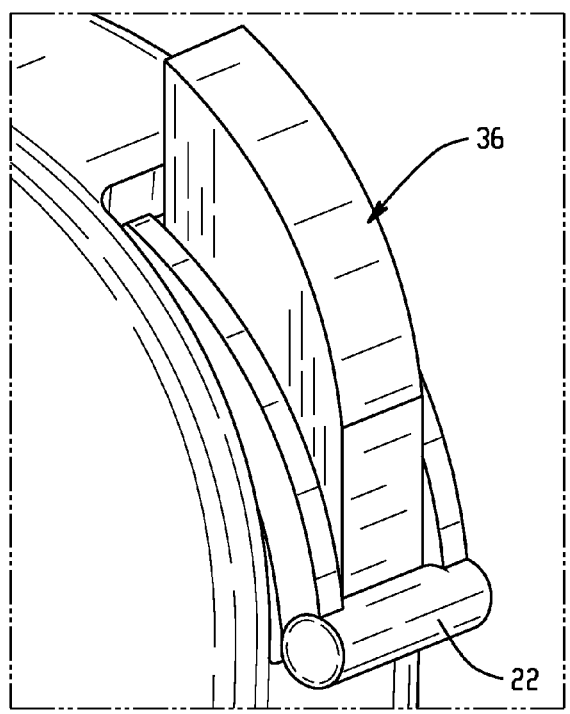
FIG. 7 is a back isometric view of a power inverter casing.

Turning now to FIGS. 6 and 7, a recess illuminating element 26 is illustrated. The recess illuminating element 26 can be of a size and shape to fit into the recess 20. The recess illuminating element 26 can elevate from an un-illuminated first position 34 (FIG. 6) to an illuminated second position 36 (FIG. 7) upon the application of force to the recess illuminating element 26. For example, the recess illuminating element 26 can contain a push mechanism, such that when a force is applied to the recess illuminating element 26, it emerges from the recess 20 to supply a source of light. The recess illuminating element 26 can comprise a light emitting diode.

Figure 8:
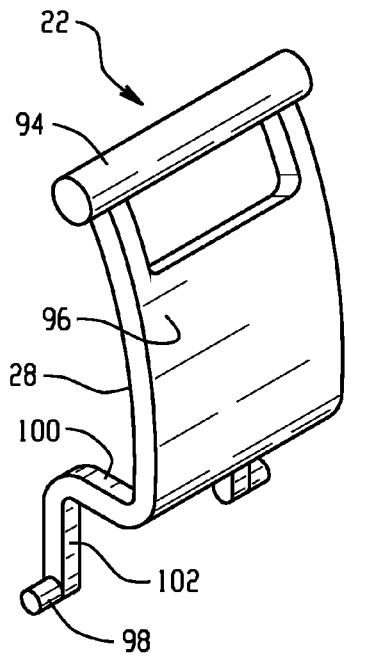
FIG. 8 is an isometric view of a handle for a power inverter casing.
Figure 9:
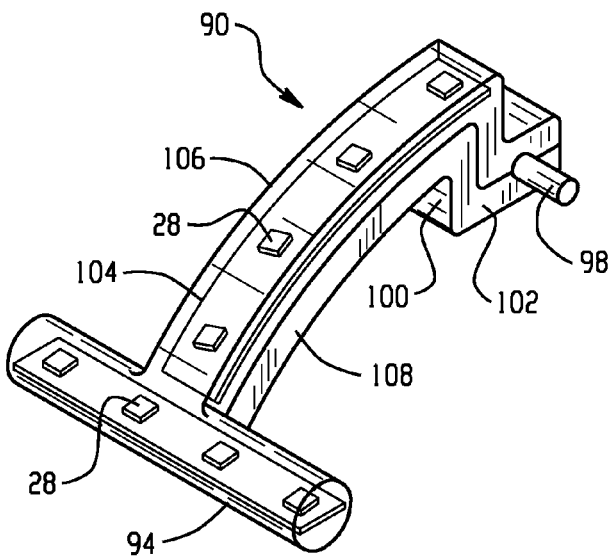
FIG. 9 is an isometric view of a handle for a power inverter casing.
Figure 10:
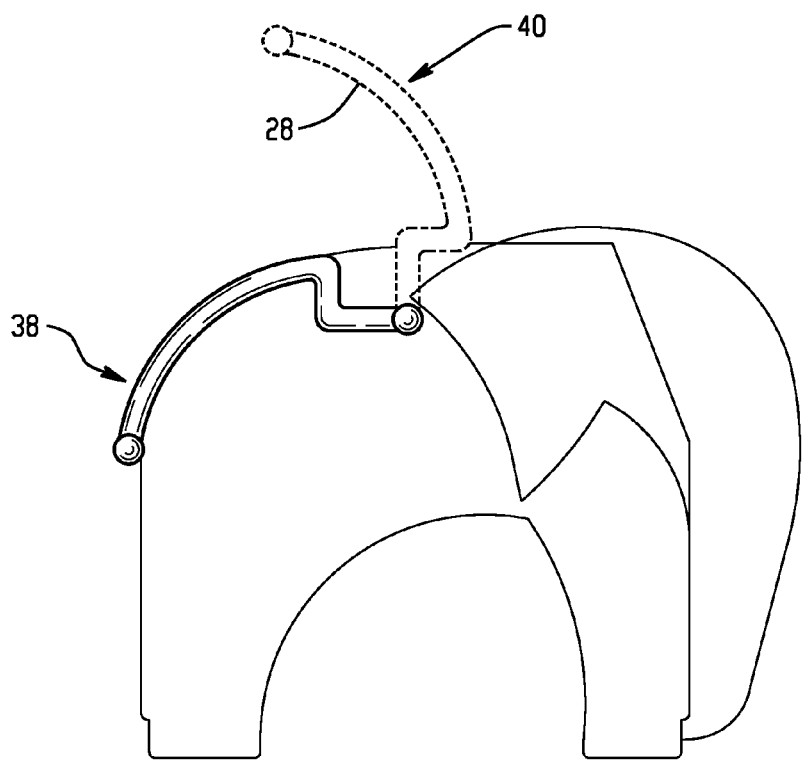
FIG. 10 is a side view of a power inverter casing.

Various embodiments of a handle 22, 90, 92 are illustrated in FIGS. 8 to 14. As illustrated in FIGS. 8 and 9, the handle 22 can comprise a handle illuminating element 28 that can move from an un-illuminated resting position 38 to an illuminated non-resting position 40 (FIG. 10). The handle illuminating element 28 can comprise a light emitting diode, e.g., a light emitting diode strip 104, such as illustrated in FIG. 9. As illustrated in FIG. 8, the handle 22 can comprise a base member 94 having a generally circular cross section attached to a body member 96 where the body member 96 further comprises a first portion 100 and second portion 102 that can lead to an attachment member 98 which connects the handle 22 to the first component 14 and/or the second component 16. The attachment member 98 can be a pin like member that inserts into a corresponding hole located on the first component 14 and/or the second component 16. The attachment member 98 can also, optionally, be located on the first component 14 and/or the second component 16 with a corresponding hole located on the handle 92 (see FIG. 13).

FIG. 9 illustrates another handle 90, where the base member 94 and attachment member 98 are similar to those illustrated in FIG. 8. For example, FIG. 9 illustrates that the body of handle 90 can have a top portion 106 and a bottom portion 108 such that an illuminating element 28 can be sandwiched between the top portion 106 and the bottom portion 108. In this case, the top portion 106 and the bottom portion 108 can either or both comprise a transparent material to allow the illuminating element 28 to provide light to the surrounding area and the handle 90 can provide a light source whether in a resting position 38 or in a non-resting position 40. The bottom portion 108 can be designed with surface features (e.g., prismatic structures and/or surface texturing) that can provide diffused light to spread out the light (e.g., to hide the light sources giving an even glow).

The handle illuminating element 28 on the handle 22, 90, 92 can be powered on or off when the inverter is turned on and off. The handle illuminating element 28 on the handle 22, 90, 92 can also be powered on and off through a separate mechanism such that the handle illuminating element 28 does not automatically turn on when the inverter is turned on. For example, a switch can be placed on the handle 22, 90, 92 to power the handle illuminating element 28. Alternatively, the power of the handle illuminating element 28 can be based upon the position such that the handle illuminating element 28 can be off when the handle 22, 90, 92 is in the resting position 38 and on when the handle illuminating element 28 is in the non-resting position 40. The handle 22, 90, 92 can be made from a thermally conductive material as described herein for adequate heat dissipation (e.g., for carrying purposes) to dissipate heat into the body 12 away from the handle 22, 90, 92 and out of the body 12. For example, if a low wattage (e.g., less than 0.5 Watt) illuminating element is used for the handle illuminating element 28 (e.g., a low Watt LED strip), a transparent plastic heat sink can be used (e.g., polycarbonate); if a high wattage (e.g., greater than 0.5 Watt) illuminating element is used for the handle illuminating element 28 (e.g., a high Watt LED strip), a thermally conductive plastic heat sink (e.g., KONDUIT*, commercially available from SABIC Innovative Plastics) or a metal can be used.

Figure 11:
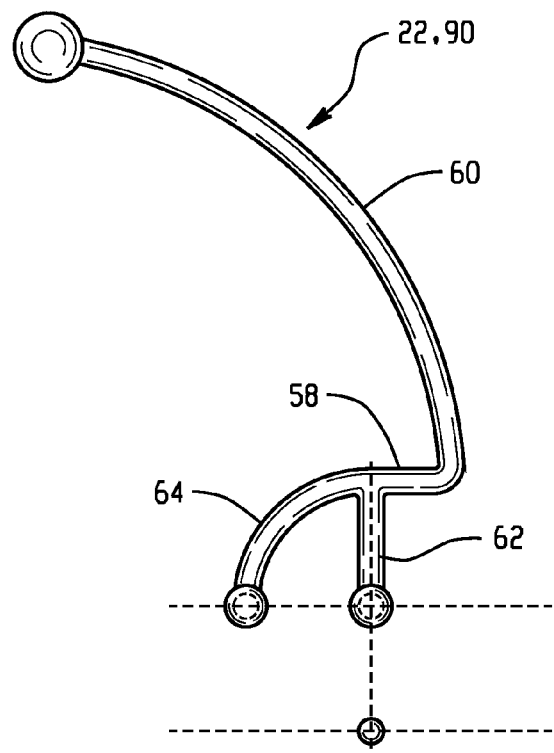
FIG. 11 is a side view of a handle of a power inverter casing.
Figure 12:
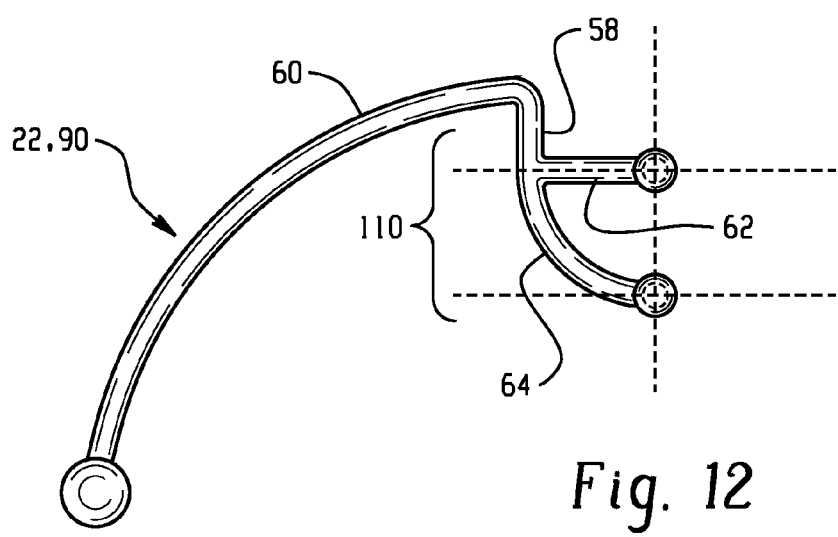
FIG. 12 is a side view of a handle of a power inverter casing.

FIGS. 11 and 12 illustrate an embodiment where the handle 22, 90 can be attached to the first component 14 and/or the second component 16 by an attachment mechanism 110 comprising a body portion 58 integrally connected to a movable portion 60. A projection 62 can extend from an end of the body portion 58 and an end of the movable portion 60 with an angled projection 64, e.g., a quarter circle, extending from the same end of the body portion 58 as the projection 62. This attachment mechanism 110 can be formed in one piece (e.g., injection molded) and can alter the center of gravity of the handle 22, 90 so that it is not always that same point and thus, can prevent rocking or swaying of the handle 22, 90 when in the non-resting position 40 (see FIGS. 8 and 10) and/or when the inverter is being carried.

Figure 13:
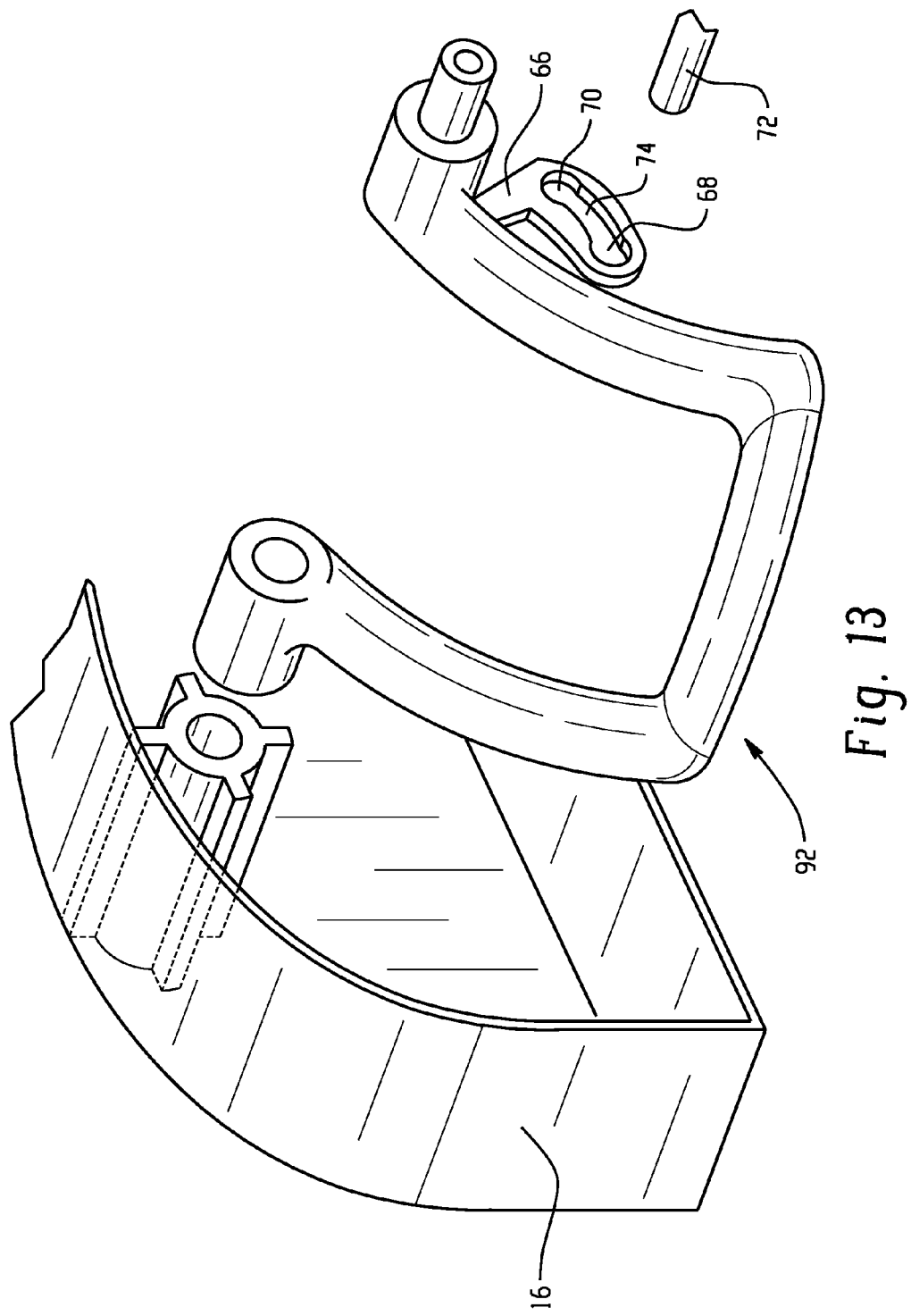
FIG. 13 is an isometric view of a handle of a power inverter casing.

Turning now to FIG. 13, another handle 92 is illustrated. As illustrated in FIG. 13, the handle 92 can comprise a slot 66 on a side of the handle 92. The slot 66 can contain a first slot opening 68 that is connected to a second slot opening 70 by a passage 74, where the first slot opening 68 and the second slot opening 70 can be configured to accept a pin 72. The pin 72 can have a shape that is configured to compliment the first slot opening 68 and the second slot opening 70 and can have a size that is greater than the size of the passage 74 to prevent the pin 72 from moving. When the pin 72 is inserted into the first slot opening 68, the handle 92 can be located in the resting position 38 and when the pin 72 is inserted into the second slot opening 70, the handle 92 can be located in the non-resting position 40. When the handle 92 is in the non-resting position 40, the handle illuminating element 28 can be exposed.

Figure 14:
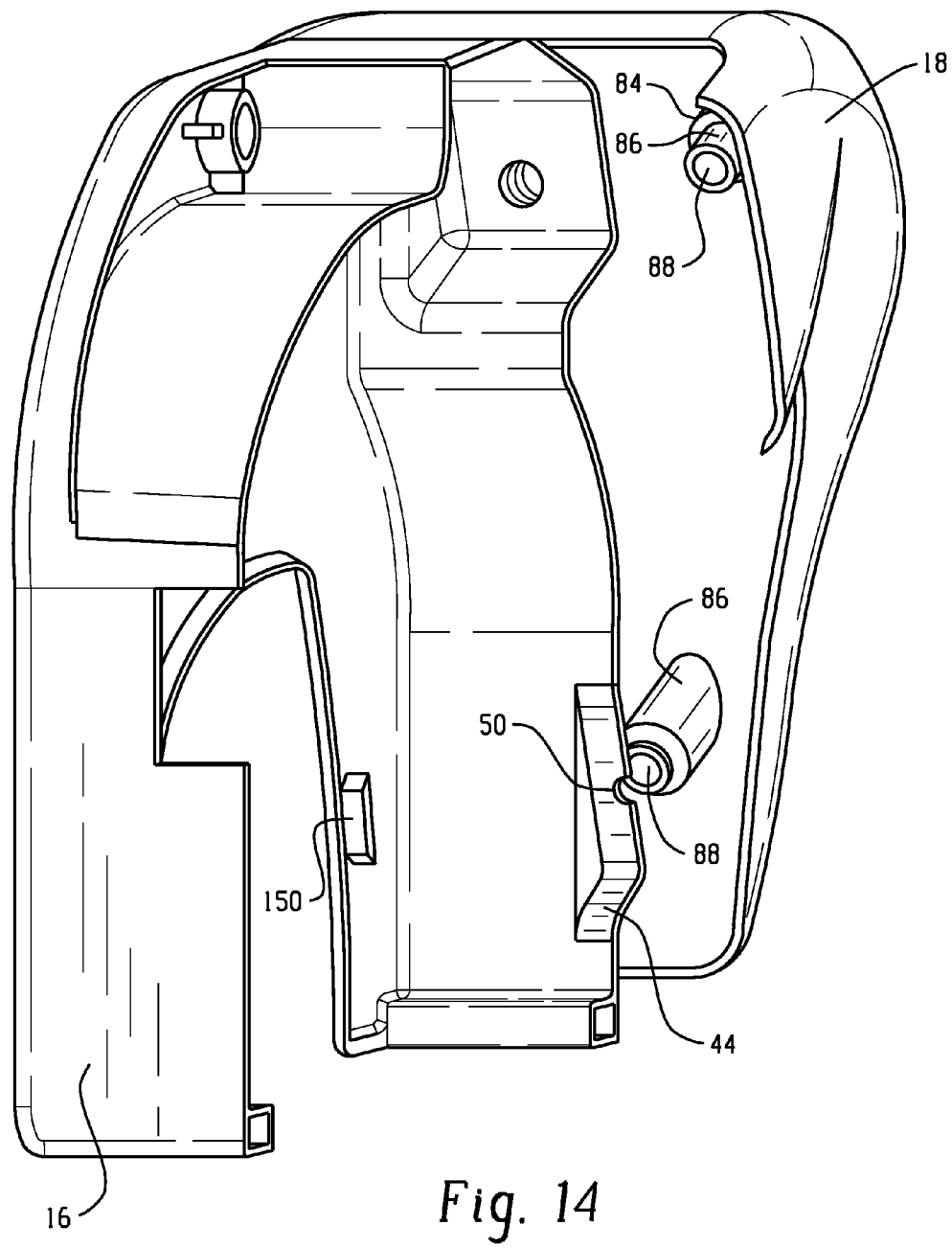
FIG. 14 is an isometric back view of a power inverter casing.
Figure 15:
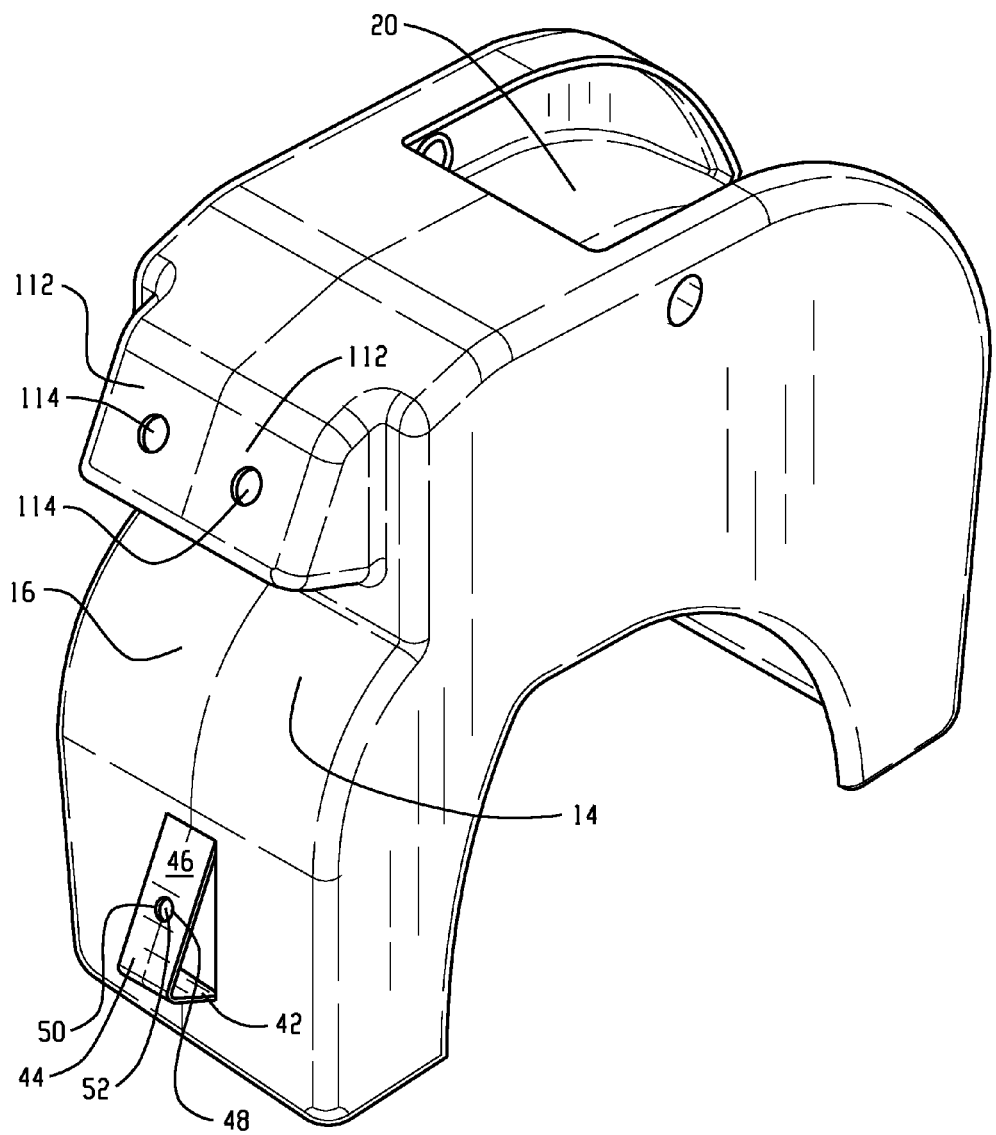
FIG. 15 is an isometric view of a power inverter casing.

FIGS. 14 and 15 illustrate an embodiment where the first component 14 can be attached to the second component 16 via an attachment clip 46. For example, the first component 14 can comprise a first component clip portion 42 and the second component 16 can comprise a second component clip portion 44 forming the attachment clip 46. The first component clip portion 42 can comprise an indentation 48 and the second component clip portion 44 can comprise a corresponding indentation 50 forming an opening 52 in the attachment clip 46 allowing the member 18 to be connected to the first component 14 and the second component 16. FIGS. 14 and 15 further illustrate how the member 18 can be attached to the first component 14 and the second component 16. For example, as illustrated in FIG. 15, the first component 14 and/or the second component 16 can comprise a projection 112 with an opening 114 that corresponds to the attachment point 84 on the member 18.

Figure 16:
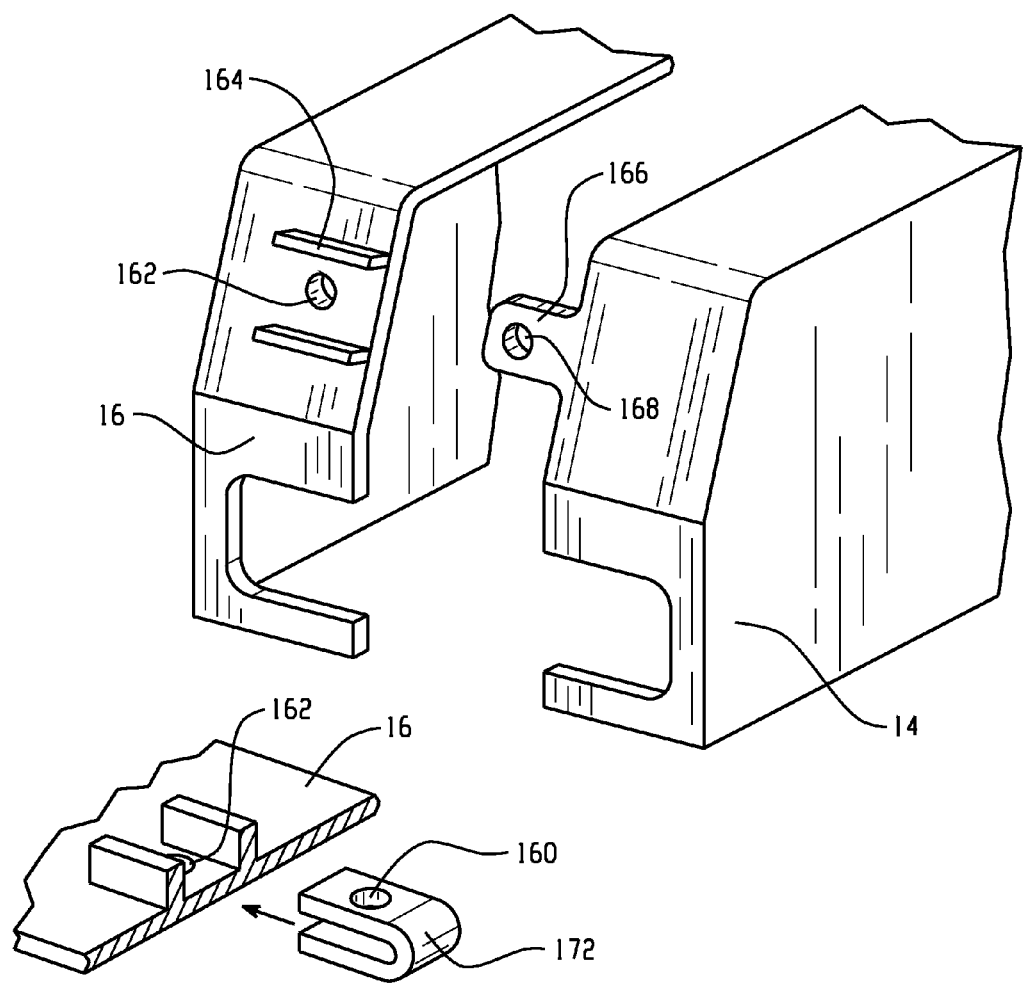
FIG. 16 is an isometric view of the joining details for a power inverter casing.

FIG. 16 illustrates another option of attaching the first component 14 to the second component 16. In FIG. 16, a fastener 172 can be inserted into the second component 16 such that fastener opening 160 and second component opening 162 are in alignment. The fastener 172 can contain internal threads. The first component 14 can then be attached to the first component 16 by aligning the first component opening 168 of the first component extension 166 with the fastener opening 160. A screw can then be inserted into the aligned openings 160, 162, 168. Such a method can be advantageous, since the first component 14 and the second component 16 can be integrated without having to thread the first component 14 and/or the second component 16. The embodiments illustrated in FIGS. 14, 15, and 16 can eliminate the use of self-tapping screws which cut threads in the power inverter casing 10. Instead, threads can be provided in the attachment clip 46 which can hold the first component 14 to the second component 16 so that when a screw or other fastener is inserted, the screw can attach to corresponding mating threads in the attachment clip 46 and thus, integrate the first component 14 and the second component 16. A further advantage of the fastener 172 comprising threads is that, if the threads are stripped, e.g., through repeated use or improper use, the fastener 172 can readily be replaced without requiring replacement of the first component 14 or the second component 16.

Figure 17:
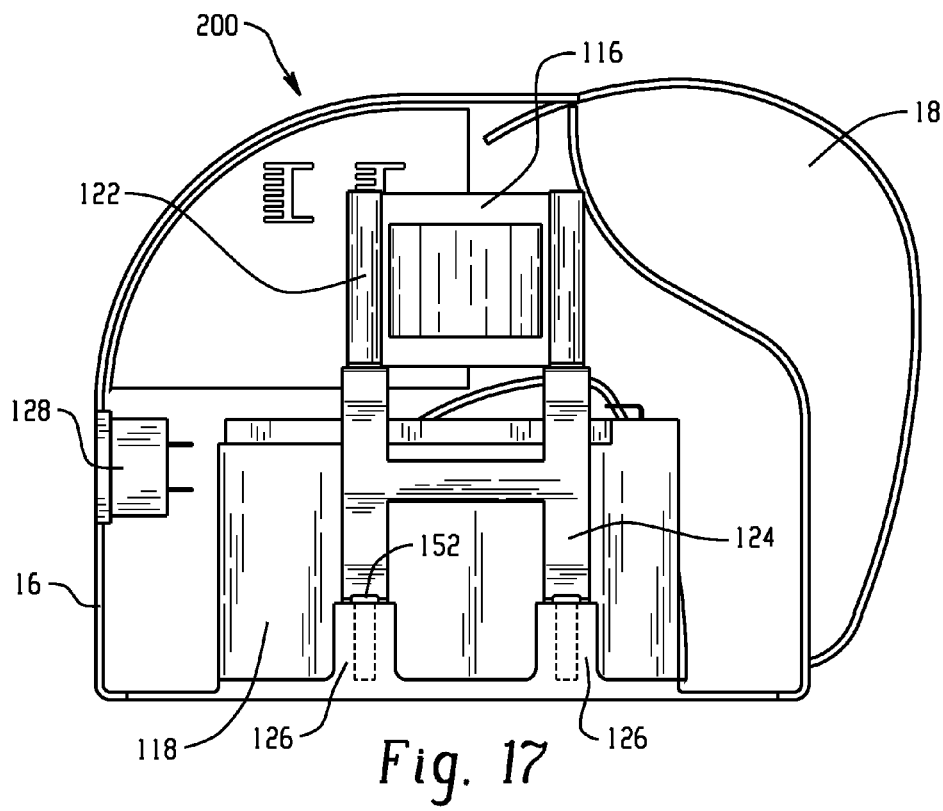
FIG. 17 is a side plan view of an inverter.
Figure 18:
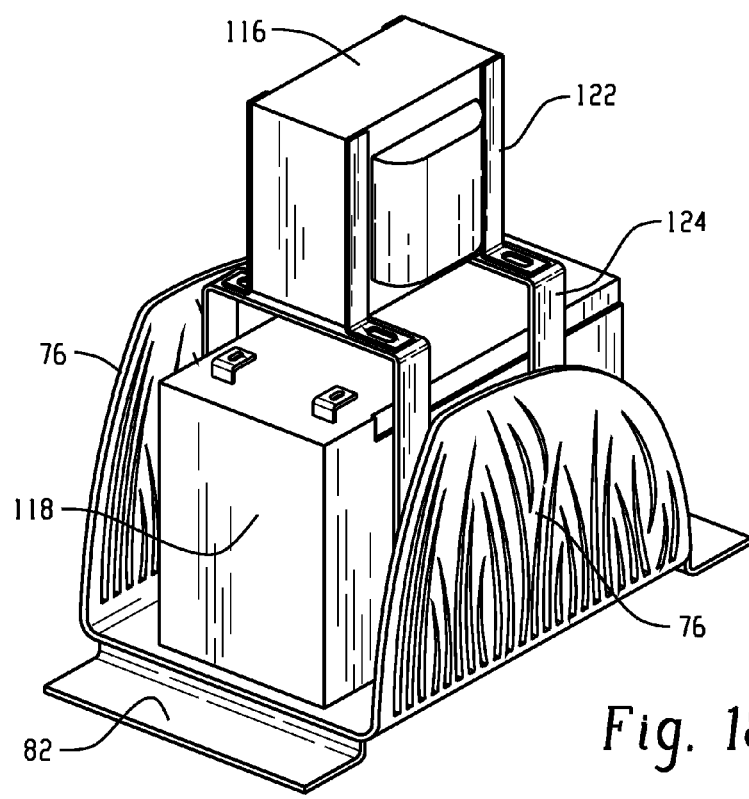
FIG. 18 is an isometric view of an inverter.
Figure 19:
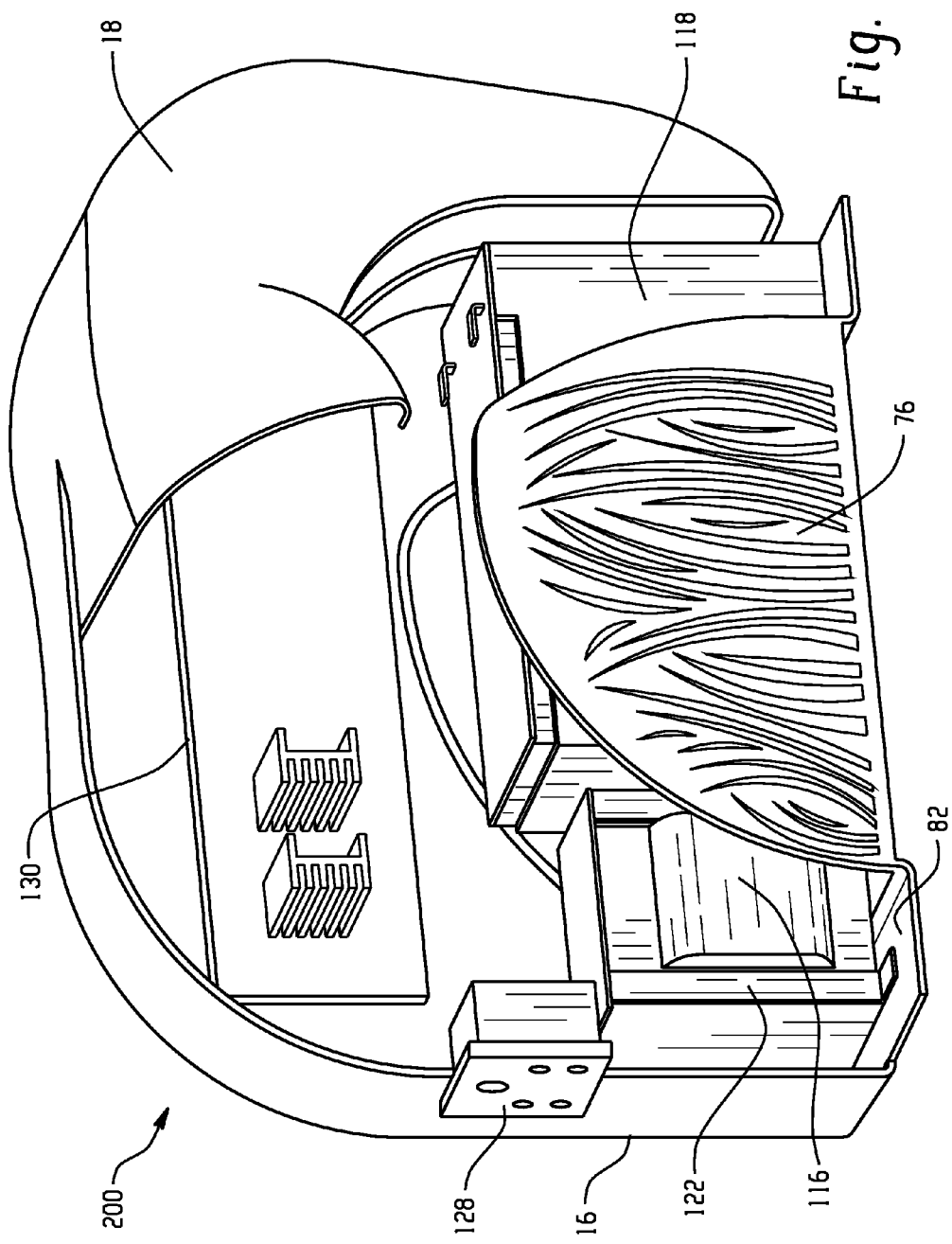
FIG. 19 is an isometric side view of an inverter.

Turning now to FIGS. 17 to 24, various mounting mechanisms for the internal components of the power inverter casing 10 are illustrated. For example, as illustrated in FIG. 17, in an inverter 200, a transformer 116 can be mounted over the battery 118. The battery 118 is generally the heaviest component of the inverter 200, so mounting the battery 118 at the bottom of the power inverter casing 10 can provide stability to the overall system. The transformer 116 can generate a lot of heat, so vents can be located adjacent the transformer 116, on the member 18 and/or on the first component 14 and/or on the second component 16 to allow for heat dissipation. As illustrated in FIGS. 17 and 18, the transformer 116 can be mounted over the battery 118 through brackets 122 that can be attached to a cage 124 which is attached to an attachment member 152 in bosses 126 extending from the platform 82 of the grill 76. FIG. 19 illustrates an embodiment of an inverter 200 where the battery 118 and the transformer 116 can be mounted in series with the distance between them capable of being adjusted to allow for air circulation. Also illustrated in FIG. 19 are socket 128 and printed circuit board assembly 130.

Figure 20:
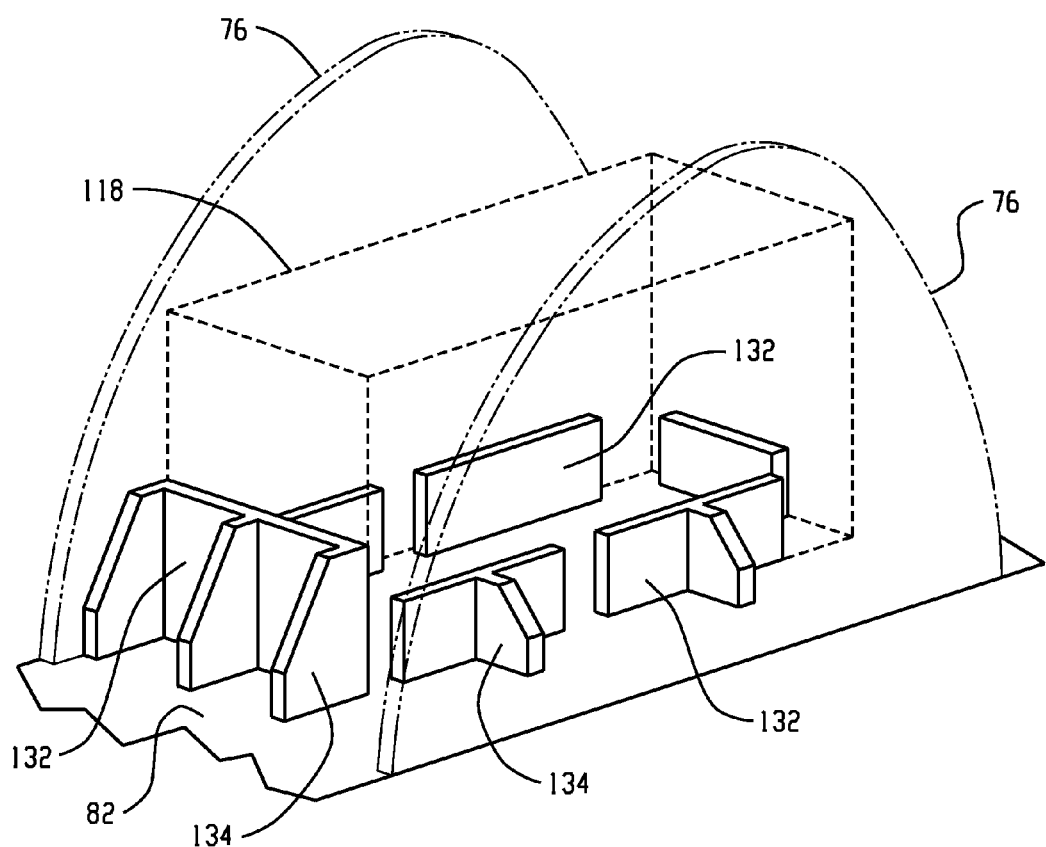
FIG. 20 is an isometric view of a battery mounted in a power inverter casing.

FIG. 20 illustrates an arrangement where the battery 118 can be mounted on the platform 82 and surrounded by walls 132 (e.g., plastic walls). The walls 132 can be provided along the periphery of the battery 118 with a clearance (e.g., about 1 millimeter) for loading and unloading of the battery 118. The walls 132 can optionally include a flexible lining (e.g., rubber lining) to prevent interplay between the battery 118 and the walls 132. Extension 134 and/or walls 132 can prevent lateral movement of the battery.

Figure 21:
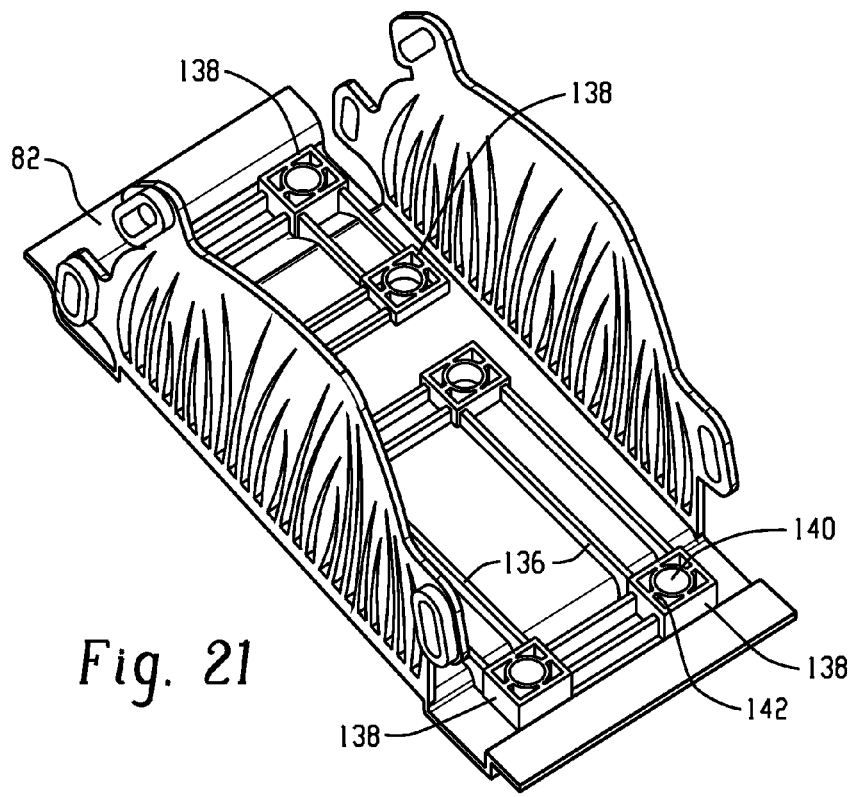
FIG. 21 is an isometric view of a grill for a power inverter casing.
Figure 22:
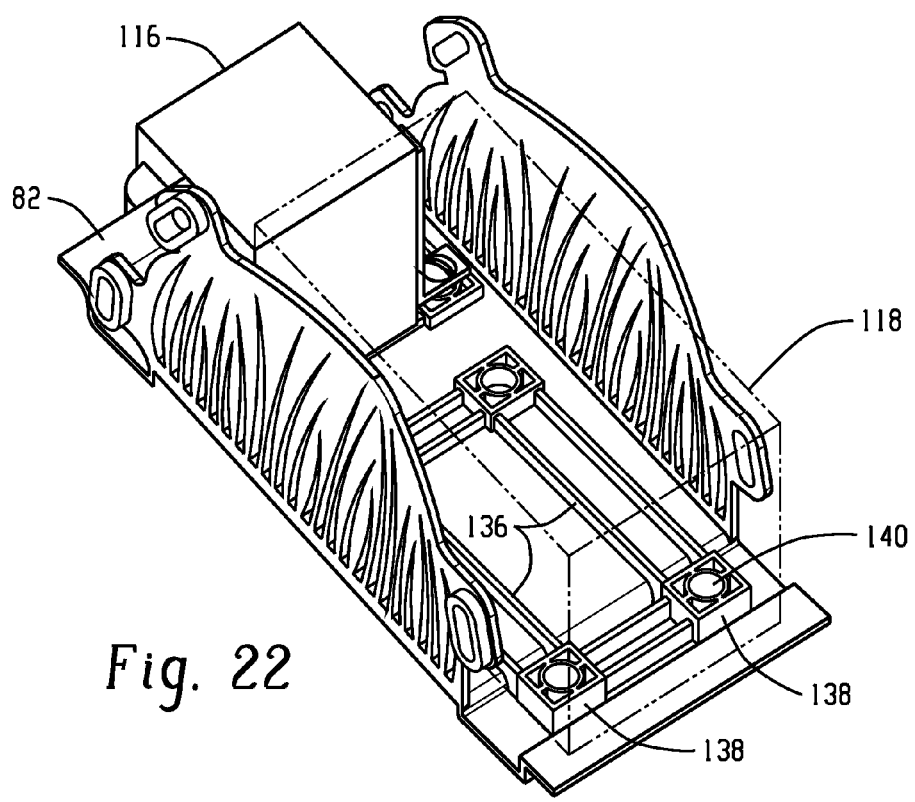
FIG. 22 is an isometric view of a grill for a power inverter casing.

Turning now to FIGS. 21 and 22, another example of mounting the battery 118 and the transformer 116 is illustrated. As illustrated, the platform 82 can comprise ribs 136 dispersed between mounting columns 138. For example, as illustrated in FIGS. 21 and 22, ribs 136 can extend from mounting column 138 to mounting column 138 around a bottom edge of the battery 118 near the periphery. Ribs 136 can also help absorb the weight of the battery 118 in the case of a fall or in a static load bearing scenario. For example, the mounting columns 138 can transfer a static load of the transformer 116 and/or battery 118 to the platform 82, while the ribs 136 can be designed to provide adequate stiffness to bear bending moments imposed during an impact. The static weight of the transformer 116 can put the mounting columns 138 in a predominantly compressive stress mode, which can be desirable because for a given temperature and stress level, the creep rate in compression mode is lower compared to the shear stress mode. A bushing can, optionally, be inserted inside a bore 140 of the mounting columns 138 to provide further support to the mounting columns 138.

As illustrated in FIGS. 21 and 22, the mounting columns 138 can have a bore 140 extending into, and optionally through, the mounting columns 138 which are dimensioned to receive an attachment element (e.g., a screw), where the mounting column 138 can have structural ribs 142 extending from the bore 140 to an edge of the mounting columns 138.

Figure 23:
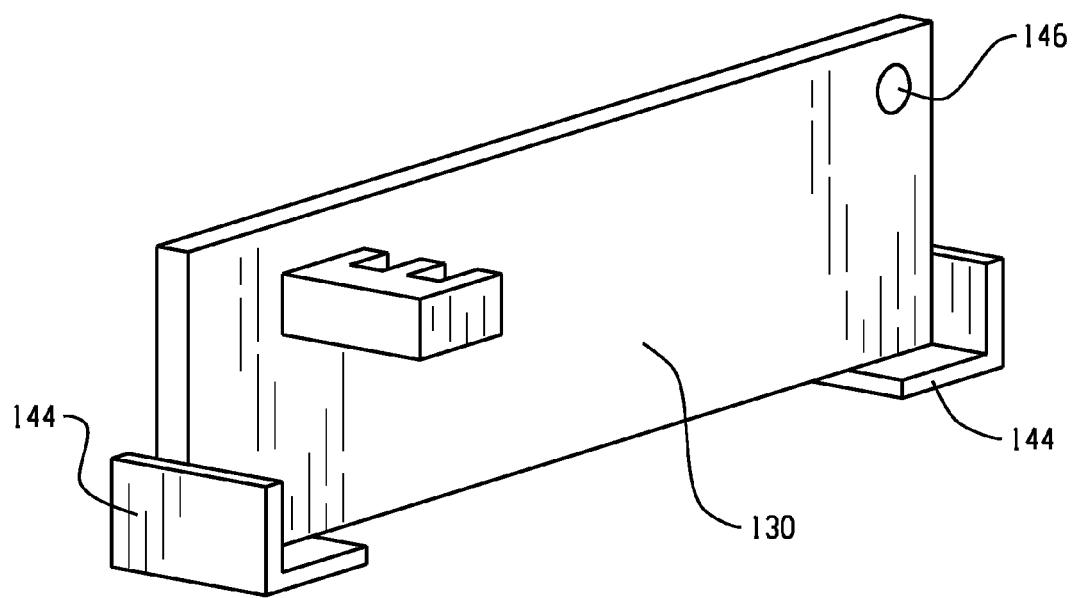
FIG. 23 is an isometric view of a mounting mechanism for a printed circuit board.

FIG. 23 illustrates a mounting mechanism for the printed circuit board assembly 130, where the printed circuit board assembly 130 can be attached to supports 144 at an edge of the printed circuit board assembly 130 closest to the battery 118. The support 144 can be located on the first component 14 or the second component 16 and can be attached to the first component 14 or the second component 16 through an attachment mechanism which can align onto an opening 146 located on the printed circuit board assembly 130 and prevent it from falling onto the other components of the inverter 200.

FIG. 24 illustrates a mechanism for attaching the first component 14 and the second component 16 to the grill 76. For example, as illustrated in FIG. 24, the grill 76 can be integrated into the first component 14 and the second component 16 via locking recesses 148, which are configured to attach the grill 76 to the first component 14 and/or the second component 16 with corresponding locking projections 150 (see FIG. 14) on the first component 14 and/or the second component 16. Other locking mechanisms are contemplated herein including but not limited to, snap fit, keyhole, tongue and groove, and combinations comprising at least one of the foregoing.

The inverter disclosed herein can have enhanced structural integrity, e.g., as is evidenced by a structural impact test (SIT). The SIT includes surrounding the assembled inverter housing system with expandable polystyrene (EPS) packing material, enclosing the housing system and packing material in a six sided, cardboard container having a wall thickness of 3 mm, specifically, 2 mm. The container is then dropped from a height of 1.0 meter (m) onto a carpeted surface with concrete under the carpet on each side of the container. After the container has been dropped so that all sides contact the surface, the container is opened and the power inverter casing and internal components of the inverter are visually observed for any damage. With the power inverter casing disclosed herein, no visible damage occurs to the power inverter casing or to the internal components located therein at a cardboard container wall thickness of 3 mm or of 2 mm. In embodiments where the packing material is not present, the inverter housing system can withstand a fall from a distance of 0.75 m (e.g., a distance of less than or equal to 0.75 m), and even from a distance of 1.0 m, with no visible damage to the power inverter casing or the internal components located therein.

The overall dimensions of the power inverter casing are dependent upon the particular transformer and battery size. For example, the dimensions can be a width of greater than or equal to 90 millimeters (mm), specifically, greater than or equal to 100 mm, more specifically, greater than or equal to 110 mm, still more specifically, greater than or equal to 115 mm, and even more specifically, greater than or equal to 120 mm. The length of the first component 14 and the second component 16 can be greater than or equal to 200 mm, specifically, greater than or equal to 210 mm, more specifically, greater than or equal to 220 mm, still more specifically, greater than or equal to 230 mm, even more specifically, greater than or equal to 240 mm, and yet more specifically still, greater than or equal to 250 mm. The length of the body 12 including the first component 14, second component 16, and member 18 can be greater than or equal to 260 mm, specifically, greater than or equal to 270 mm, more specifically, greater than or equal to 275 mm, still more specifically, greater than or equal to 280 mm, even more specifically, greater than or equal to 290 mm, and yet more specifically still, greater than or equal to 300 mm. The power inverter casing can comprise a height of greater than or equal to 100 mm, specifically, greater than or equal to 150 mm, more specifically, greater than or equal to 175 mm, even more specifically, greater than or equal to 210 mm, and still more specifically, greater than or equal to 230 mm.

The power inverters disclosed herein can generally be any shape, including, but not limited to various animal shapes. The power inverters can generally comprise a body having the shape of an animal with a nose and face having a power button and/or indicator lights (e.g., on, off, low battery, etc.) The nose portion can also have illuminating members for providing light to an area (e.g., during a power outage). For example, as illustrated in the figures, the power inverter can have a body having the general shape of an elephant with a tail forming the handle and a trunk forming the member having a member illuminating element. The tail can be any of the handles described herein with or without an illuminating member present on the tail. The trunk portion of the elephant can form the member, which can pivot as illustrated in FIG. 3 to expose a member illuminating element. The trunk portion of the elephant can further comprise a power button and indicator lights. The legs of the elephant can form the first leg member (e.g., the front legs) and the second leg member (e.g., the back legs). The trunk can further comprise the pivotable portion and the stationary portion such when the pivotable portion is moved from the closed position to the open positions, the member illuminating element powers on and supplies light. The grills between the first member and the second member (e.g., between the two halves of the elephant) can have openings to allow for heat dissipation of the internal components of the power inverter. It is to be understood, however, that the shape is not limited to an elephant and that other shapes are herein contemplated, including, but limited to, a camel, a horse, a lion, a tiger, zebra, and so on, and so forth.

In an embodiment, a power inverter casing, comprises: a body having a first component removably attached to a second component, wherein, when joined, a recess is formed therebetween; a member removably attached to the first component and the second component opposite the recess; and a handle located in the recess and removably attached to the first component and the second component; wherein the member contains a first member illuminating element, and/or the recess contains a recess illuminating element, and/or the handle contains a handle illuminating element.

In an embodiment, a power inverter casing comprises: a body having a first component removably attached to a second component, wherein, when joined, a recess is formed therebetween; a member removably attached to the first component and the second component opposite the recess; and a handle located in the recess and removably attached to the first component and the second component; wherein the member comprises a pivotable portion and a stationary portion, wherein the pivotable portion rotates from a closed position to an open position exposing a member illuminating element.

In an embodiment, a power inverter casing comprises: a body having an animal shape having a first component removably attached to a second component, wherein, when joined, a recess is formed therebetween; a member removably attached to the first component and the second component opposite the recess; and a handle located in the recess and removably attached to the first component and the second component; wherein the member contains a first member illuminating element, and/or the recess contains a recess illuminating element, and/or the handle contains a handle illuminating element.

In the various embodiments, (i) the member illuminating element, and/or the recess illuminating element, and/or the handle illuminating element comprise a light emitting diode; and/or (ii) the member rotates from an un-illuminated closed position to an illuminated open position to reveal the member illuminating element; and/or (iii) the recess illuminating element elevates from an un-illuminated first position to an illuminated second position upon the application of force to the recess illuminating element; and/or (iv) the handle illuminating element moves from an un-illuminated resting position to an illuminated non-resting position; and/or (v) the handle illuminating element is located inside the handle; and/or (vi) the power inverter casing comprises a thermoplastic material; and/or (vii) the first component comprises a first component clip portion and the second component comprises a second component clip portion forming an attachment clip configured to attach the first component and the second component; and/or (viii) the first component clip portion comprises an indentation and the second component clip portion comprises an indentation forming an opening in the attachment clip allowing the member to be connected to the first component and the second component; and/or (ix) the member illuminating element comprises a light emitting diode; and/or (x) the handle comprises a body portion integrally connected to a movable portion, wherein the body portion comprises a projection extending from the body portion to the body and an angled projection extending from the projection to the body; and/or (xi) the handle comprises a slot on a side of the handle, wherein the slot contains a first slot opening connected to a second slot opening through a passage, wherein the first slot opening and the second slot opening are configured to accept a pin; and/or (xii) when the pin is inserted into the first slot opening, the handle is in a resting position and when the pin is inserted into the second slot opening, the handle is in a non-resting position; and/or (xiii) the pin has a size that is greater than the size of the passage; and/or (xiv) a handle illuminating element is exposed when the handle is in the non-resting position; and/or (xv) the handle illuminating element comprises a light emitting diode; and/or (xvi) the animal shape is an elephant having a trunk forming the member and a tail forming the handle; and/or (xvii) the trunk and/or the tail have an illuminating element.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to distinguish one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. All cited patents, patent applications, and other references are incorporated herein by reference in their entirety. However, if a term in the present application contradicts or conflicts with a term in the incorporated reference, the term from the present application takes precedence over the conflicting term from the incorporated reference. While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A power inverter casing, comprising:
   a body having a first component removably attached to a second component, wherein, when joined, a recess is formed therebetween;
   a member removably attached to the first component and the second component opposite the recess; and
   a handle located in the recess and removably attached to the first component and the second component;
   wherein at least one of
      the member contains a first member illuminating element,
      the recess contains a recess illuminating element that elevates from an un-illuminated first position to an illuminated second position upon the application of force to the recess illuminating element, and
      the handle contains a handle illuminating element.

2. The power inverter casing of claim 1, wherein at least one of the member illuminating element, the recess illuminating element, and the handle illuminating element, comprise a light emitting diode.

3. The power inverter casing of claim 1, wherein the member rotates from an un-illuminated closed position to an illuminated open position to reveal the member illuminating element.

4. The power inverter casing of claim 1, wherein the handle illuminating element moves from an un-illuminated resting position to an illuminated non-resting position.

5. The power inverter casing of claim 1, wherein the handle illuminating element is located inside the handle.

6. The power inverter casing of claim 1, wherein the power inverter casing comprises a thermoplastic material.

7. The power inverter casing of claim 1, wherein the first component comprises a first component clip portion and the second component comprises a second component clip portion forming an attachment clip configured to attach the first component and the second component.

8. The power inverter casing of claim 7, wherein the first component clip portion comprises an indentation and the second component clip portion comprises an indentation forming an opening in the attachment clip allowing the member to be connected to the first component and the second component.

9. A power inverter casing, comprising:
   a body having a first component removably attached to a second component, wherein, when joined, a recess is formed therebetween;
   a member removably attached to the first component and the second component opposite the recess; and a handle located in the recess and removably attached to the first component and the second component;

wherein the member comprises a pivotable portion and a stationary portion, wherein the pivotable portion rotates from a closed position to an open position exposing a member illuminating element;

wherein the handle comprises a body portion integrally connected to a movable portion, wherein the body portion comprises a projection extending from the body portion to the body and an angled projection extending from the projection to the body; and wherein at least one of
 the member contains a first member illuminating element,
 the recess contains a recess illuminating element that elevates from an un-illuminated first position to an illuminated second position upon the application of force to the recess illuminating element, and
 the handle contains a handle illuminating element.

10. The power inverter casing of claim 9, wherein the power inverter casing comprises a thermoplastic material.

11. The power inverter casing of claim 9, wherein the member illuminating element comprises a light emitting diode.

12. The power inverter casing of claim 9, wherein the handle comprises a slot on a side of the handle, wherein the slot contains a first slot opening connected to a second slot opening through a passage, wherein the first slot opening and the second slot opening are configured to accept a pin.

13. The power inverter casing of claim 12, wherein when the pin is inserted into the first slot opening, the handle is in a resting position and when the pin is inserted into the second slot opening, the handle is in a non-resting position.

14. The power inverter casing of claim 13, wherein the pin has a size that is greater than the size of the passage.

15. The power inverter casing of claim 13, wherein a handle illuminating element is exposed when the handle is in the non-resting position.

16. The power inverter casing of claim 15, wherein the handle illuminating element comprises a light emitting diode.

17. A power inverter casing, comprising:
 a body having an animal shape having a first component removably attached to a second component, wherein, when joined, a recess is formed therebetween;
 a member removably attached to the first component and the second component opposite the recess; and
 a handle located in the recess and removably attached to the first component and the second component;
 wherein the animal shape is an elephant having a trunk forming the member and a tail forming the handle; and
 wherein at least one of
  the member contains a first member illuminating element,
  the recess contains a recess illuminating element that elevates from an un-illuminated first position to an illuminated second position upon the application of force to the recess illuminating element, and
  the handle contains a handle illuminating element.

18. The power inverter casing of claim 17, wherein at least one of the trunk and the tail have an illuminating element.

* * * * *